(12) United States Patent
Maeda et al.

(10) Patent No.: US 11,705,361 B2
(45) Date of Patent: Jul. 18, 2023

(54) METHOD OF MANUFACTURING SEMICONDUCTOR DEVICE

(71) Applicant: RENESAS ELECTRONICS CORPORATION, Tokyo (JP)

(72) Inventors: Hitoshi Maeda, Tokyo (JP); Tatsuyoshi Mihara, Tokyo (JP); Hiroki Shinkawata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 99 days.

(21) Appl. No.: 17/369,714

(22) Filed: Jul. 7, 2021

(65) Prior Publication Data

US 2022/0068706 A1  Mar. 3, 2022

(30) Foreign Application Priority Data

Sep. 3, 2020  (JP) ................. 2020-148113

(51) Int. Cl.
*H01L 21/762* (2006.01)
*H01L 21/304* (2006.01)
*H01L 27/12* (2006.01)
*H10B 10/00* (2023.01)

(52) U.S. Cl.
CPC ...... *H01L 21/76224* (2013.01); *H01L 21/304* (2013.01); *H01L 21/7624* (2013.01); *H01L 27/1203* (2013.01); *H10B 10/12* (2023.02)

(58) Field of Classification Search
CPC ............ H01L 21/76224; H01L 21/304; H01L 21/3212; H01L 21/76885; H01L 21/76897; H01L 21/76895; H01L 21/823475; H01L 21/7624; H01L 27/1203; H01L 27/1207; H01L 21/84; H01L 27/1104; H01L 29/66477; H01L 21/823425; H01L 29/66553; H01L 21/823468; H10B 10/12
See application file for complete search history.

(56) References Cited

U.S. PATENT DOCUMENTS

| | | | |
|---|---|---|---|
| 9,935,125 B2 | 4/2018 | Tsunomura et al. | |
| 9,984,929 B1* | 5/2018 | Czornomaz | ..... H01L 21/823475 |
| 2013/0295734 A1* | 11/2013 | Niebojewski | ... H01L 21/823443 438/197 |
| 2017/0162574 A1* | 6/2017 | Kim | ..................... H01L 29/0649 |
| 2017/0194211 A1* | 7/2017 | Lai | .................... H01L 21/823475 |
| 2017/0345750 A1* | 11/2017 | Tsuboi | ............. H01L 21/823814 |
| 2018/0151427 A1* | 5/2018 | Chung | ............. H01L 21/76883 |
| 2020/0006139 A1* | 1/2020 | Tseng | ................ H01L 21/76816 |
| 2020/0035555 A1* | 1/2020 | Zang | ................... H01L 21/7684 |
| 2020/0043794 A1* | 2/2020 | Su | ......................... H01L 29/6653 |
| 2020/0365698 A1* | 11/2020 | Tsai | ................... H01L 21/76849 |
| 2021/0225768 A1* | 7/2021 | Peng | .................. H01L 21/76224 |
| 2021/0273061 A1* | 9/2021 | Wang | .................. H01L 29/1008 |

FOREIGN PATENT DOCUMENTS

JP  2013-219181 A  10/2013

* cited by examiner

*Primary Examiner* — Bac H Au
(74) *Attorney, Agent, or Firm* — McDermott Will & Emery LLP

(57) ABSTRACT

Gate patterns are formed on a semiconductor layer and a conductive film is formed on the semiconductor layer so as to cover the gate patterns. By performing a polishing process to the conductive film and patterning the polished conductive film, pad layers are formed between the gate patterns via sidewall spacers.

16 Claims, 29 Drawing Sheets

METHOD OF MANUFACTURING SEMICONDUCTOR DEVICE

CROSS-REFERENCE TO RELATED APPLICATIONS

The disclosure of Japanese Patent Application No. 2020-148113 filed on Sep. 3, 2020 including the specification, drawings and abstract is incorporated herein by reference in its entirety.

BACKGROUND

The present invention relates to a method of manufacturing a semiconductor device and particularly to a method of manufacturing a semiconductor device having a conductive film formed on an impurity region to be a source region or a drain region.

As a low power consumption semiconductor device, a technology of forming a MISFET (Metal insulator Semiconductor Field Effect Transistor) on an SOI (Silicon On Insulator) substrate having a semiconductor substrate, an insulating layer formed on the semiconductor substrate, and a silicon layer formed on the insulating layer has been known. The MISFET formed on the SOI substrate can reduce the parasitic capacitance caused by a diffusion region formed in a silicon layer. Therefore, it is possible to achieve the improvement in the operation speed of the MISFET and the reduction in the power consumption.

For example, Patent Document 1 discloses a technology of forming an epitaxial layer on a silicon layer in which a source region and a drain region of a MISFET are formed.

There are Disclosed Techniques Listed Below

[Patent Document 1] Japanese Unexamined Patent Application Publication No. 2013-219181

SUMMARY

Since a silicon layer of an SOI substrate is very thin, it is difficult to silicidize the silicon layer in which a source region and a drain region are formed. Therefore, it is effective to form an epitaxial layer on each of the source region and the drain region and to perform the silicidation in this epitaxial layer.

On the other hand, in the MISFET formed on the SOI substrate, a driving current of the MISFET is controlled by applying a voltage not only to the gate electrode formed on the silicon layer but also to the well region formed in the semiconductor substrate.

Here, there is a case in which both or one of a contact hole formed on the source region and a contact hole formed on the drain region may be formed on an element isolation portion on which no epitaxial layer is formed. Namely, the contact hole is not formed at a desired position in some cases, resulting in the occurrence of the defect that the contact hole penetrates the element isolation portion. In addition, since the silicon layer is very thin as described above, even when the contact hole is formed at the desired position, the defect that the contact hole penetrates the silicon layer and further the insulating layer formed below the silicon layer may occur if the growth of the epitaxial layer is insufficient. Then, if the contact hole penetrates the element isolation portion or the silicon layer, the defect that the source region or the drain region and the well region are short-circuited through a plug formed in the contact hole occurs.

Therefore, it has been desired that the technology capable of suppressing such a defect is developed and the reliability of the semiconductor device having the MISFET is improved. Other problems and novel features will be apparent from the description of this specification and the accompanying drawings.

According to an embodiment, a method of manufacturing a semiconductor device includes steps of: (a) providing an SOI substrate having a semiconductor substrate, an insulating layer formed on the semiconductor substrate, and a semiconductor layer formed on the insulating layer; (b) after the (a), forming a first conductive film on the semiconductor layer; (c) after the (b), forming a first insulating film on the first conductive film; (d) after the (c), patterning the first conductive film and the first insulating film, thereby forming a gate pattern and a cap film; (e) after the (d), implanting an impurity into the semiconductor layer located on both sides of the gate pattern, thereby forming a first impurity region; (f) after the (e), forming a first sidewall spacer made of a second insulating film on a side surface of the gate pattern; (g) after the (f) forming a second conductive film on the first impurity region so as to cover the gate pattern, the cap film, and the first sidewall spacer; (h) after the (g) performing a polishing process to the second conductive film until the cap film is exposed; (i) after the (h), patterning a part of the second conductive film, thereby forming a pad layer made of the remaining second conductive film; and (j) after the (i), filling a portion from where the second conductive film has been removed, with a third insulating film.

Also, according to another embodiment, a method of manufacturing a semiconductor device includes steps of: (a) forming a first conductive film on a semiconductor substrate; (b) after the (a), forming a first insulating film on the first conductive film; (c) after the (b), patterning the first conductive film and the first insulating film, thereby forming a gate pattern and a cap film; (d) after the (c), implanting an impurity into the semiconductor substrate located on both sides of the gate pattern, thereby forming a first impurity region; (e) after the (d), forming a first sidewall spacer made of a second insulating film on a side surface of the gate pattern; (f) after the (e), forming a second conductive film on the first impurity region so as to cover the gate pattern, the cap film, and the first sidewall spacer; (g) after the (f), performing a polishing process to the second conductive film until the cap film is exposed; (h) after the (g), patterning a part of the second conductive film, thereby forming a pad layer; and (i) after the (h), filling a portion from where the second conductive film has has been removed, with a third insulating film.

According to one embodiment, it is possible to improve the reliability of the semiconductor device.

DETAILED DESCRIPTION

Figure 1:
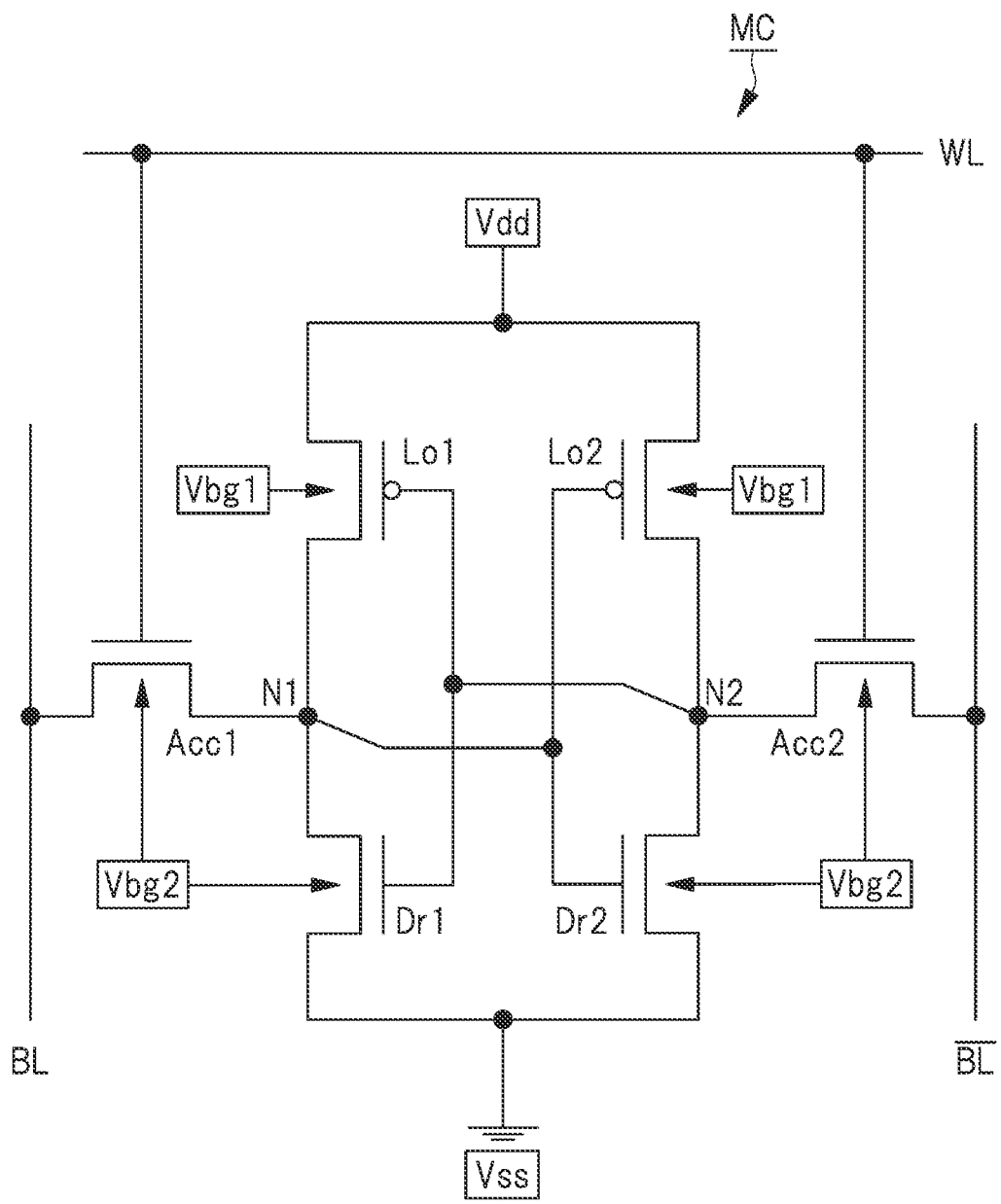
FIG. 1 is a circuit diagram showing a memory cell of a semiconductor device according to the first embodiment.

Hereinafter, embodiments will be described in detail with reference to drawings. Note that, in all of the drawings for describing the embodiments, the members having the same function are denoted by the same reference characters and the repetitive descriptions thereof are omitted. Also, in the embodiments below, the description of the same or similar components is not repeated in principle unless required particularly.

Also, in the drawings used in this application, in order to make the drawings easy to see, the hatching is omitted in some cases even in a cross-sectional view and the hatching is added in some cases even in a plan view.

In addition, the X direction, the Y direction, and the Z direction used in the description of this application intersect each other and orthogonally cross each other. In this application, the Z direction is described as a vertical direction, a height direction, or a thickness direction of a certain structure in some cases. Further, the expression of "in a plan view" used in this application means that a surface formed by the X direction and the Y direction is seen in the Z direction.

First Embodiment

<Configuration of Memory Cell MC>

A semiconductor device according to the first embodiment and a method of manufacturing the semiconductor device will be described below. First, a memory cell MC of an SRAM circuit included in the semiconductor device will be described with reference to FIG. 1 and FIG. 2.

As shown in FIG. 1, a memory cell MC is arranged at an intersection of a pair of bit lines BL and/BL and a word line WL. This memory cell MC includes a pair of load transistors Lo1 and Lo2, a pair of access transistors Acc1 and Acc2, and a pair of driver transistors Dr1 and Dr2. The load transistors Lo1 and Lo2 are p-channel transistors, and the access transistors Acc1 and Acc2 and the driver transistors Dr1 and Dr2 are n-channel transistors.

Of the six transistors constituting the memory cell MC, the load transistor Lo1 and the driver transistor Dr1 constitute a CMOS inverter, and the load transistor Lo2 and the driver transistor Dr2 constitute another CMOS inverter. Nodes N1 and N2 which are the mutual input/output terminals of the pair of CMOS inverters are cross-linked to constitute a flip-flop circuit as an information storage unit that stores 1-bit information.

The connection of the six transistors mentioned above will be described below.

The load transistor Lo1 is connected between a power supply voltage Vdd and the node N1, the driver transistor Dr1 is connected between the node N1 and a reference voltage Vss, and gate electrodes of the load transistor Lo1 and the driver transistor Dr1 are connected to the node N2. The load transistor Lo2 is connected between the power supply voltage Vdd and the node N2, the driver transistor Dr2 is connected between the node N2 and the reference voltage Vss, and gate electrodes of the load transistor 102 and the driver transistor Dr2 are connected to the node N1.

The access transistor Acc1 is connected between the bit line BL and the node N1, the access transistor Acc2 is connected between the bit line/BL and the node N2, and gate electrodes of the access transistor Acc1 and the access transistor Acc2 are connected to the word line WL.

Figure 2:
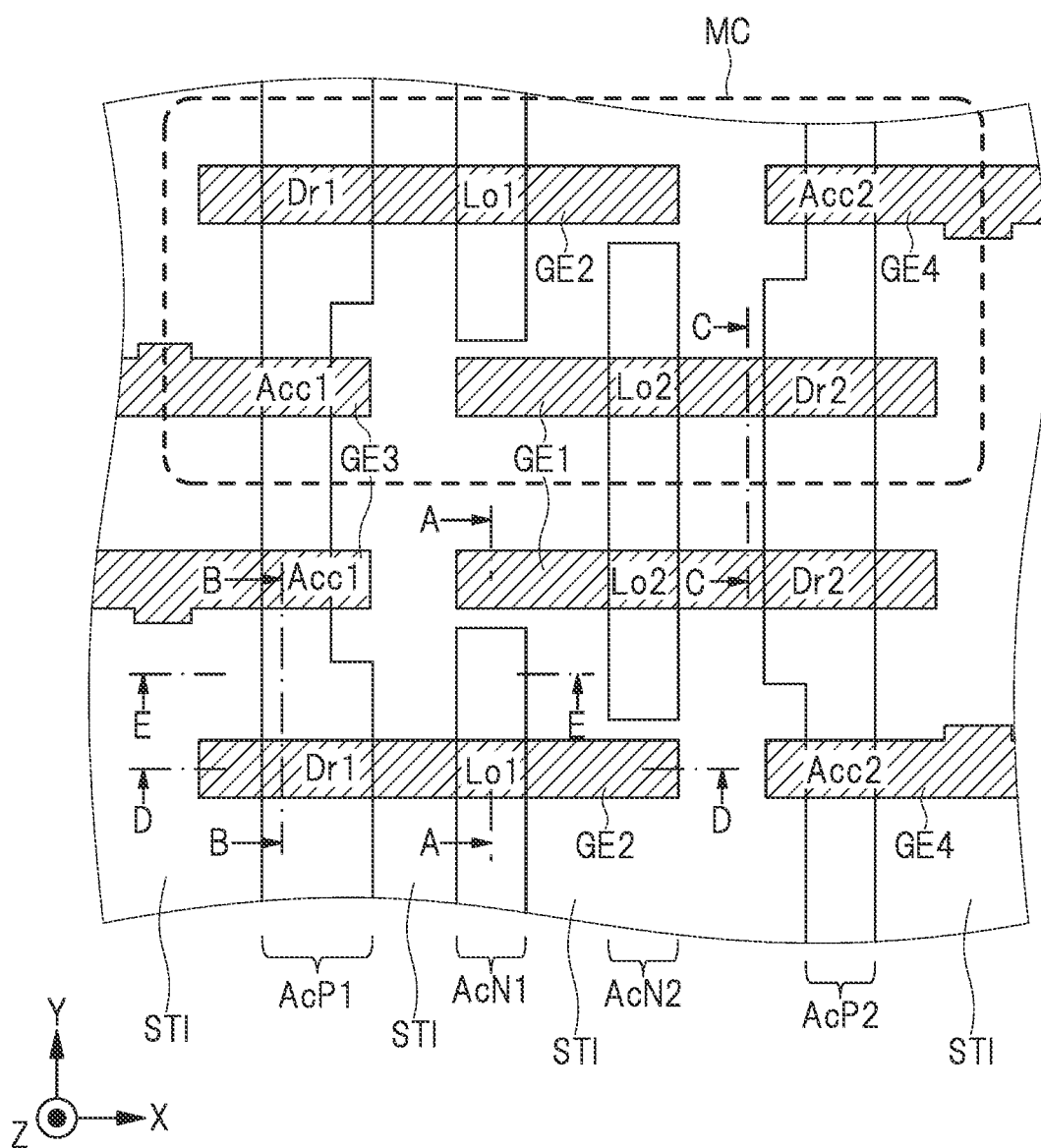
FIG. 2 is a plan view showing the memory cell of the semiconductor device according to the first embodiment.

As described later, the six transistors described above are formed on the SOI substrate having a semiconductor substrate SUB, an insulating layer BOX, and a semiconductor layer SL. As shown in FIG. 2, the SOI substrate is partitioned into a plurality of active regions by an element isolation portion STI penetrating the semiconductor layer SL and the insulating layer BOX. Of the plurality of active regions, active regions AcP1, AcP2, AcN1, and AcN2 are provided in the memory cell MC.

The active regions AcP1, AcP2, AcN1, and AcN2 each extend in the Y direction and are separated from each other in the X direction. Also, in a plan view, the active region AcN1 is adjacent to the active region AcN2 and the active region AcP1 via the element isolation portion STI, and the active region AcN2 is adjacent to the active region AcN1 and the active region AcP2 via the element isolation portion STI.

The load transistor Lo1 is formed in the active region AcN1, the load transistor Lo2 is formed in the active region AcN2, the access transistor Acc1 and the driver transistor Dr1 are formed in the active region AcP1, and the access transistor Acc2 and the driver transistor Dr2 are formed in the active region AcP2.

A p-type well region PW is formed in the semiconductor substrate SUB in the active regions AcP1 and AcP2, and an n-type well region NW is formed in the semiconductor substrate SUB in the active regions AcN1 and AcN2.

A back gate Vbg1 is applied to the n-type well region NW in the active regions AcN1 and AcN2, and a back gate voltage Vbg2 different from the back gate voltage Vbg1 is applied to the p-type well region PW in the active regions AcP1 and AcP2.

A threshold value of the load transistor Lo1 is controlled by the voltage applied to a gate electrode GE2 and the back gate voltage Vbg1, and a threshold value of the load transistor Lo2 is controlled by the voltage applied to a gate electrode GE1 and the back gate voltage Vbg1. A threshold value of the access transistor Acc1 is controlled by the voltage applied to a gate electrode GE3 and the back gate voltage Vbg2, and a threshold value of the access transistor Acc2 is controlled by the voltage applied to a gate electrode GE4 and the back gate voltage Vbg2. A threshold value of the driver transistor Dr1 is controlled by the voltage applied to the gate electrode GE2 and the back gate voltage Vbg2, and a threshold value of the driver transistor Dr2 is controlled by the voltage applied to the gate electrode GE1 and the back gate voltage Vbg2.

<Semiconductor Device>

The semiconductor device according to the first embodiment will be described below with reference to FIG. 15. First, regions 1A to 4A in the semiconductor device will be described.

Figure 14:
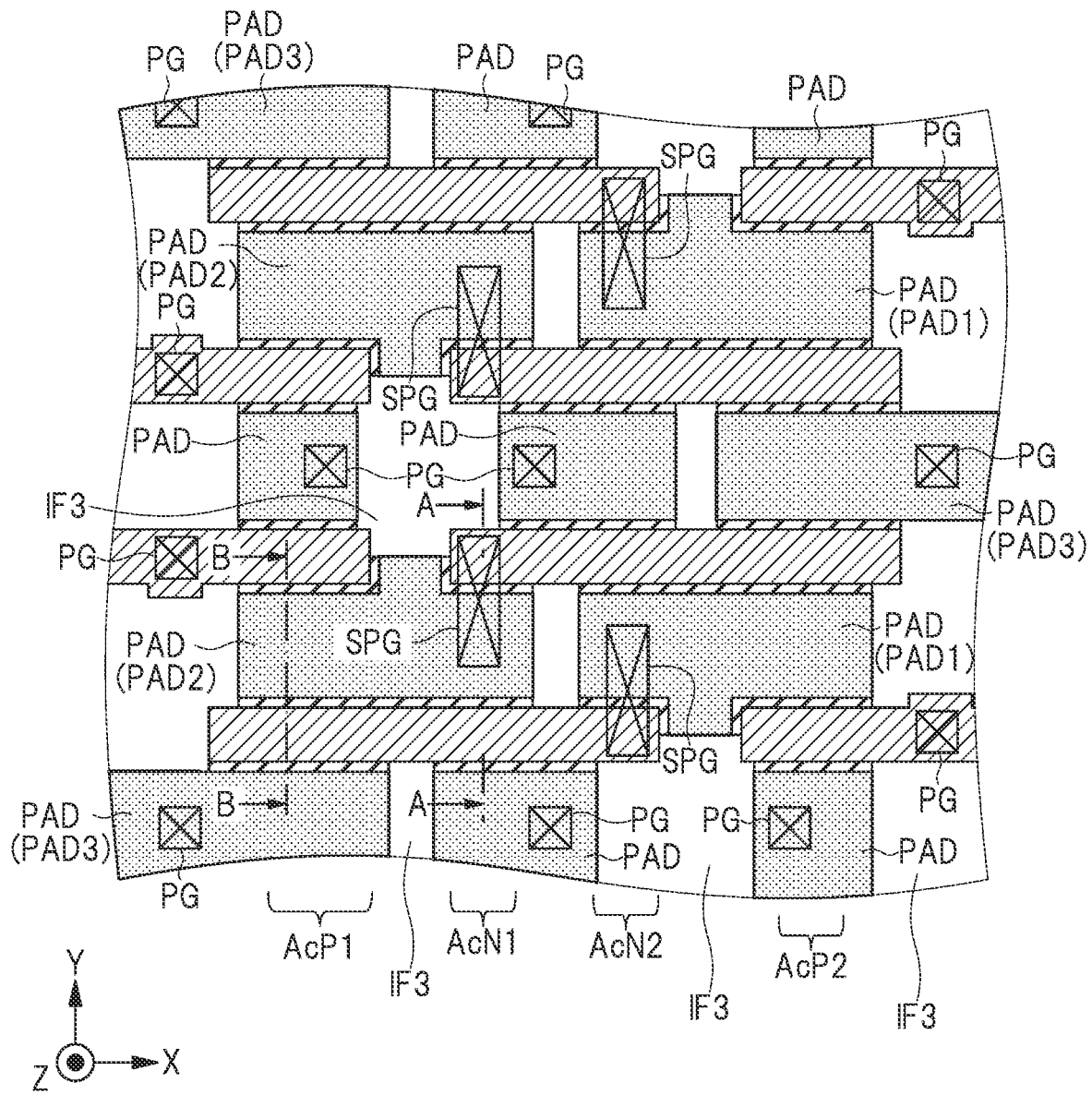
FIG. 14 is a plan view showing the memory cell of the semiconductor device in the state of FIG. 13.

The region 1A is the active region AcN1 in which a p-channel transistor is formed, and corresponds to a cross-sectional view along a line A-A (straight line) shown in FIG. 14. The region 2A is the active region AcP1 in which an n-channel transistor is formed, and corresponds to a cross-sectional view along a line B-B (straight line) shown in FIG. 14.

The region 3A is an active region in which a high withstand voltage transistor driven by a voltage higher than those of the transistors in the region 1A and the region 2A is formed. Here, a case in which a p-channel high withstand voltage transistor is formed is presented as an example. The region 4A is an active region in which a non-volatile memory cell is formed. Here, a non-volatile memory cell including a memory transistor having a silicon nitride film as a charge accumulation layer and a selection transistor adjacent to the memory transistor is presented as an example.

Note that the region 3A and the region 4A are bulk regions in which the semiconductor layer SL, and the insulating layer BOX are removed, and the high withstand voltage transistor and the non-volatile memory cell are formed on the semiconductor substrate SUB.

The detailed configuration of each of the regions 1A to 4A will be described together with the method of manufacturing the semiconductor device according to the first embodiment.

<Method of Manufacturing Semiconductor Device>

Next, the method of manufacturing the semiconductor device according to the first embodiment will be described with reference to FIG. 3 to FIG. 16.

Figure 3:
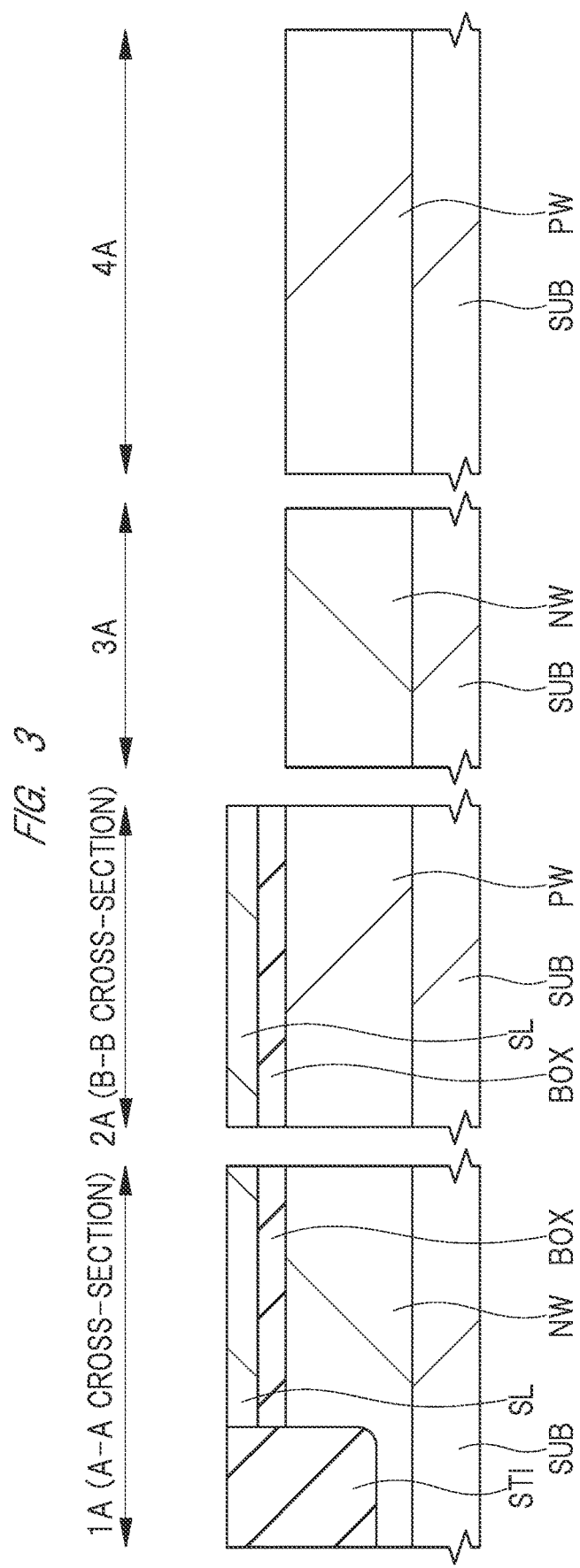
FIG. 3 is a cross-sectional view showing a manufacturing process of the semiconductor device according to the first embodiment.

First, as shown in FIG. 3, the SOI substrate having the semiconductor substrate SUB which is a support base member, the insulating layer BOX formed on the semiconductor substrate SUB, and the semiconductor layer SL formed on the insulating layer BOX is provided.

The semiconductor substrate SUB is preferably made of single crystal silicon having a specific resistance of about 1 Ωcm to 10 Ωcm and is made of, for example, p-type single crystal silicon. The insulating layer BOX is made of, for example, silicon oxide, and a thickness of the insulating layer BOX is, for example, about 10 nm to 20 nm. The semiconductor layer SL is preferably made of single crystal silicon having a specific resistance of about 1 Ωcm to 10 Ωm, and a thickness of the semiconductor layer SL is, for example, about 10 nm to 20 nm. Note that the impurity is not introduced into the semiconductor layer SL by the ion implantation and the like.

An example of the process of preparing such an SOI substrate will be described below. The SOI substrate is formed by, for example, a bonding method. In the bonding method, for example, a surface of a first semiconductor substrate made of silicon is oxidized to form the insulating layer BOX, and then a second semiconductor substrate made of silicon is pressed and bonded to the first semiconductor substrate under a high temperature condition. Thereafter, the second semiconductor substrate is thinned. As a result, the thin film of the second semiconductor substrate remaining on the insulating layer BOX becomes the semiconductor layer SL, and the first semiconductor substrate below the insulating layer BOX becomes the semiconductor substrate SUB.

Next, a trench that penetrates the semiconductor layer SL and the insulating layer BOX and reaches the semiconductor substrate SUB is formed. Next, the element isolation portion STI is formed by filling the trench with an insulating film such as a silicon oxide film. The element isolation portion STI is formed in each of the regions 1A to 4A, and a plurality of active regions is defined by the element isolation portion STI. Note that the region 1A corresponds to a cross-sectional view along the line A-A shown in FIG. 2. Further, the region 2A corresponds to a cross-sectional view along the line B-B shown in FIG. 2, Namely, the line A-A and the line B-B shown in FIG. 2 correspond to the line A-A and the line B-B shows in FIG. 14, respectively.

Next, a part of the semiconductor layer SL and the insulating layer BOX in the region 3A and the region 4A is selectively removed by the photolithography technique and the etching process. Consequently, the region 3A and the region 4A become the bulk regions.

Then, by the photolithography technique and the ion implantation method, the n-type well region NW is formed in the semiconductor substrate SUB in the region 1A and the region 3A, and the p-type well region PW is formed in the semiconductor substrate SUB in the region 2A and the region 4A.

Note that, in order to apply the back gate voltage Vbg1 and the back gate voltage Vbg2 to the well region NW of the region 1A and the well region PW of the region 2A, a part of the semiconductor layer SL, and the insulating layer BOX of the region 1A and the region 2A is removed, and the regions are used as power supply regions, but the description of the power supply region is omitted here.

Figure 4:
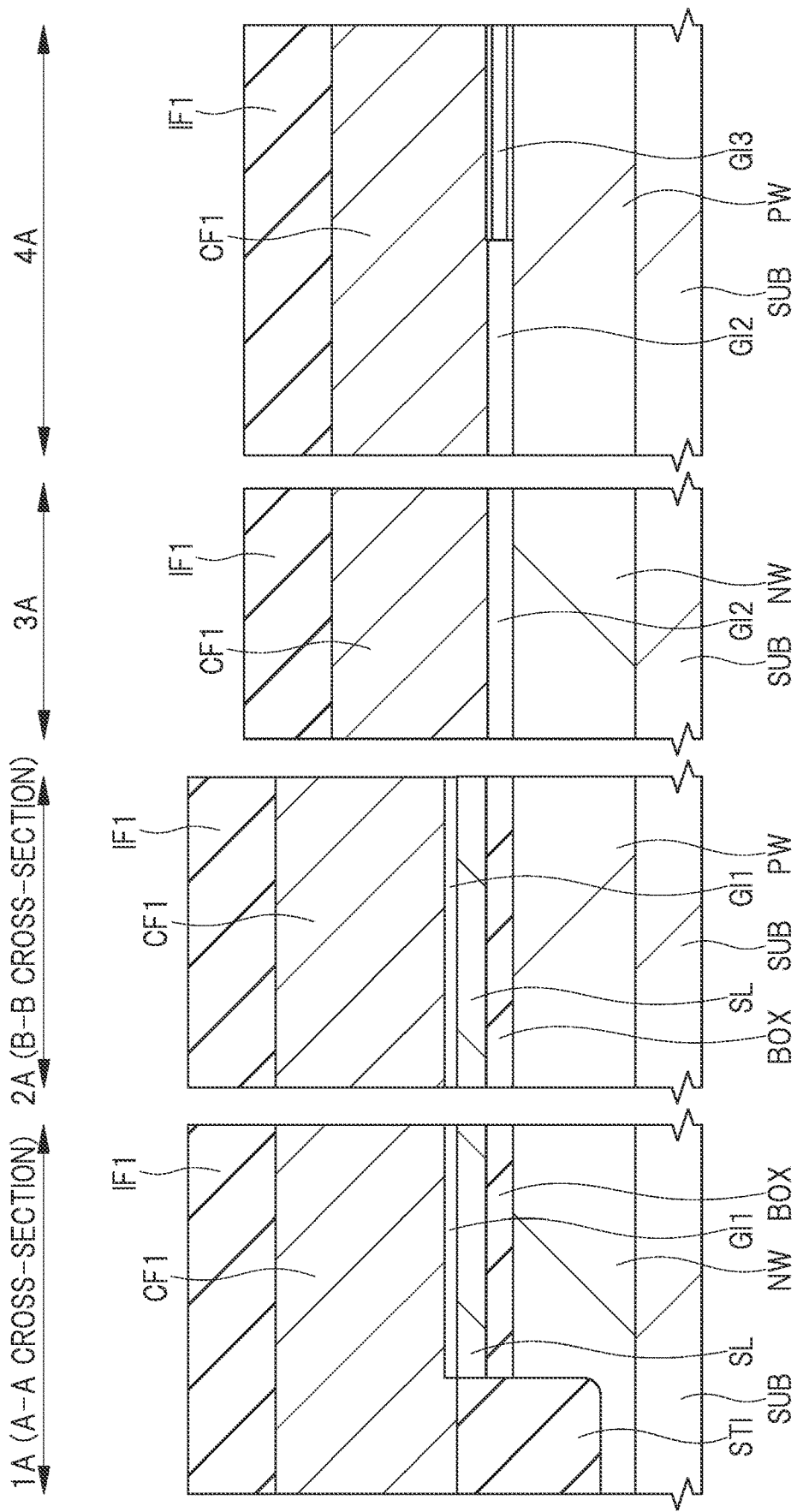
FIG. 4 is a cross-sectional view showing the manufacturing process of the semiconductor device subsequent to FIG. 3.

Next, as shown in FIG. 4, a gate insulating film is formed in each of the regions 1A to 4A. First, a gate insulating film GI2 made of, for example, silicon oxide is formed by, for example, the thermal oxidation method in each of the regions 1A to 4A. Next, by the photolithography technique and the etching process, the gate insulating film GI2 formed in the regions 1A and 2A and a part of the region 4A is removed.

Next, a gate insulating film GI3 is formed in each of the regions 1A to 4A. The gate insulating film GI3 is composed of, for example, a stacked film in which a silicon oxide film, a silicon nitride film, and a silicon oxide film are sequentially stacked. Also, the silicon nitride film mentioned above functions as a charge accumulation layer of the non-volatile memory cell. Next, by the photolithography technique and the etching process, the gate insulating film GI3 formed in the regions 1A to 3A and on the gate insulating film GI2 in the region 4A is removed.

Next, a gate insulating film GI1 made of, for example, silicon oxide is formed in the region 1A and the region 2A by, for example, the thermal oxidation method. A thickness of the gate insulating film GI1 is smaller than those of the gate insulating film GI2 and the gate insulating film GI3.

Next, a conductive film CF1 made of, for example, amorphous silicon is formed by, for example, the CVD (Chemical Vapor Deposition) method on the gate insulating film GI1 in the region 1A and the region 2A, on the gate insulating film GI2 in the region 3A and the region 4A, on the gate insulating film GI3 in the region 4A, and on the element isolation portion STI. Next, an insulating film IF1 made of, for example, silicon oxide is formed on the conductive film CF1 by, for example, the CVD method.

Figure 5:
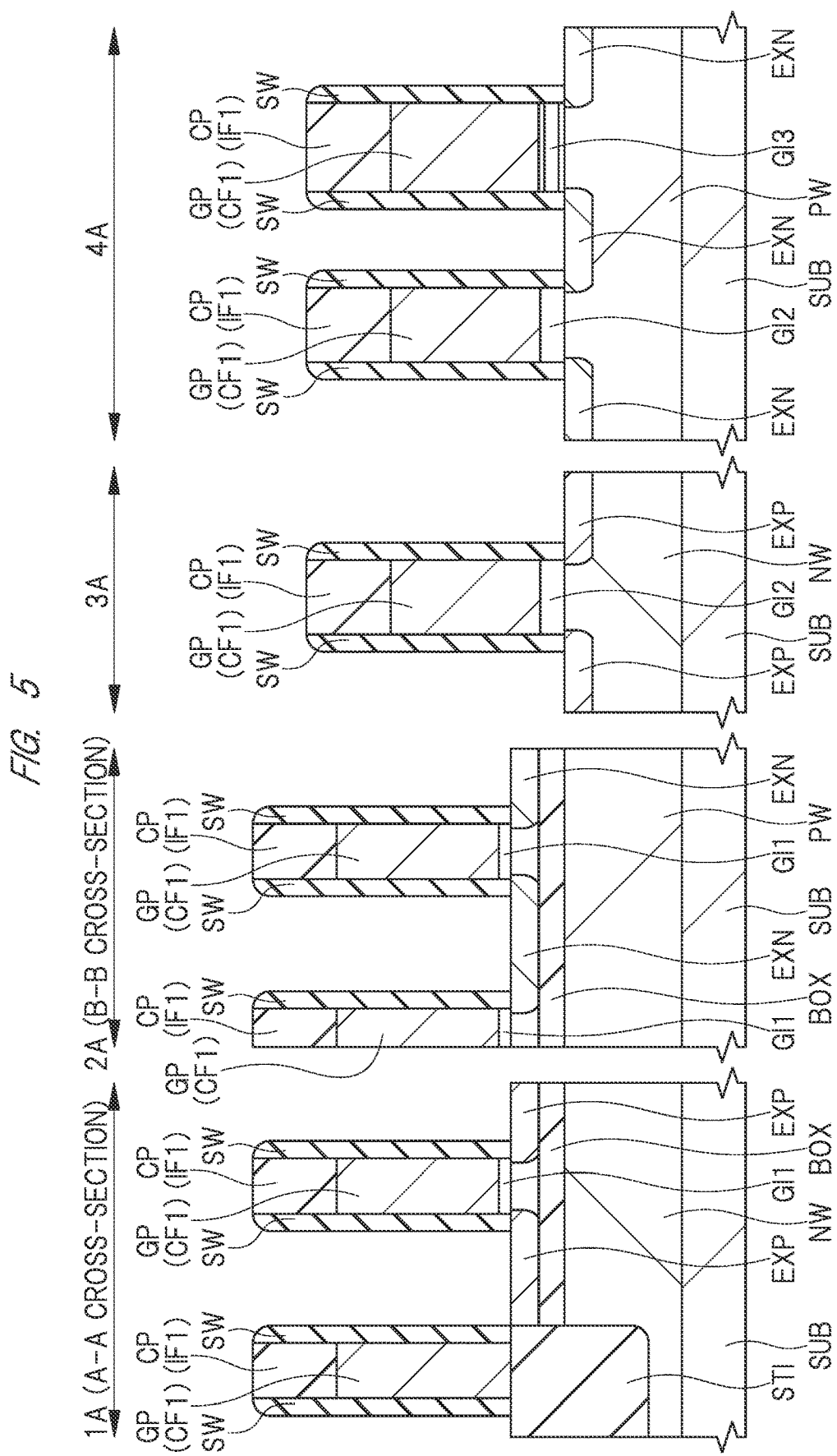
FIG. 5 is a cross-sectional view showing the manufacturing process of the semiconductor device subsequent to FIG. 4.

Next, as shown in FIG. 5, the insulating film IF1 and the conductive film CF1 are patterned by the photolithography technique and the etching process. By patterning the conductive film CF1, gate patterns GP are formed in each of the regions 1A to 4A. Also, by patterning the insulating film IF1, cap films CP are each formed on the gate patterns GP.

Next, by the photolithography technique and the ion implantation method, impurities are implanted into the semiconductor layer SL or the semiconductor substrate SUB located on both sides of the gate patterns GP (one side and the other side of two side surfaces of the gate patterns GP) in each of the regions 1A to 4A. Consequently, p-type extension regions (impurity regions) EXP are formed in the semiconductor layer SL in the region 1A, n-type extension regions (impurity regions) EXN are formed in the semiconductor layer SL in the region 2A, p-type extension regions (impurity regions) EXP are formed in the semiconductor substrate SUB in the region 3A, and n-type extension regions (impurity regions) EXN are formed in the semiconductor substrate SUB in the region 4A.

Next, in each of the regions 1A to 4A, an insulating film made of, for example, silicon nitride is formed by, for example, the CVD method so as to cover the gate patterns GP and the cap films CP. Next, by performing the anisotropic etching process to the insulating film, sidewall spacers SW made of the insulating film are formed on side surfaces of the gate patterns GP as shown in FIG. 5.

Here, if the sidewall spacer SW is made of silicon oxide like the element isolation portion STI, there is a fear that the element isolation portion STI is also etched by the anisotropic etching process and the upper surface of the element isolation portion STI significantly recedes. However, the sidewall spacer SW is made of a material different from the element isolation portion STI, for example, a material having a high etching selectivity with respect to the element isolation portion STI in the anisotropic etching process, that is, silicon nitride. Therefore, it is possible to suppress the recession of the upper surface of the element isolation portion STI to a maximum extent.

Figure 6:
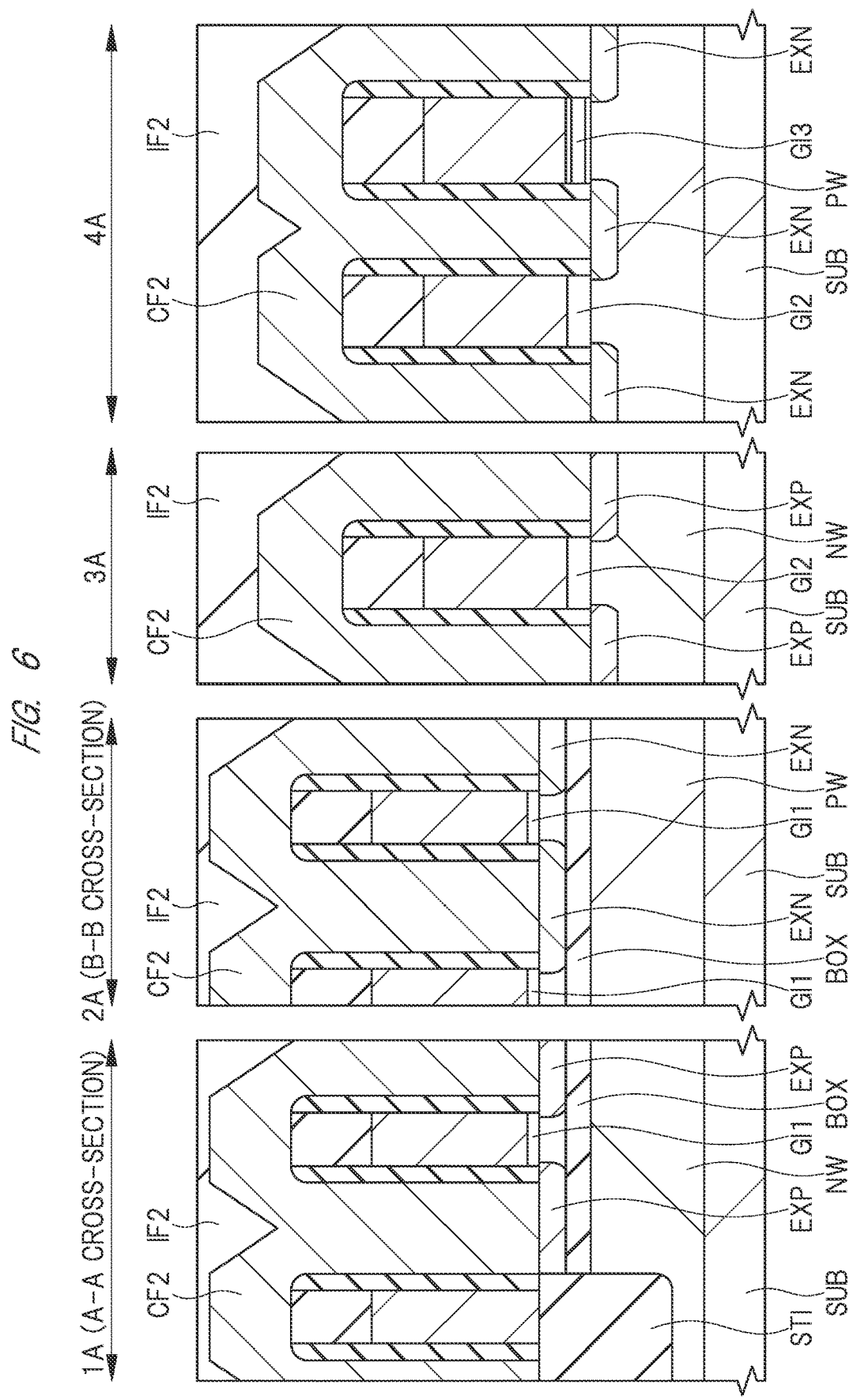
FIG. 6 is a cross-sectional view showing the manufacturing process of the semiconductor device subsequent to FIG. 5.

Next, as shown in FIG. 6, in each of the regions 1A to 4A, a conductive film CF2 is formed by, for example, the CVD method on the extension regions EXP and the extension regions EXN so as to cover the gate patterns GP, the cap films CP, and the sidewall spacers SW. The conductive film CF2 is made of silicon, preferably amorphous silicon.

Next, an insulating film IF2 such as an organic insulating film is formed on the conductive film CF2 by, for example, the coating method. Although there are irregularities on the upper surface of the conductive film CF2 formed by the CVD method, the flatness can be improved by filling the irregularities with the insulating film IF2. The flattening process like this makes it easier to perform the subsequent polishing process.

Figure 7:
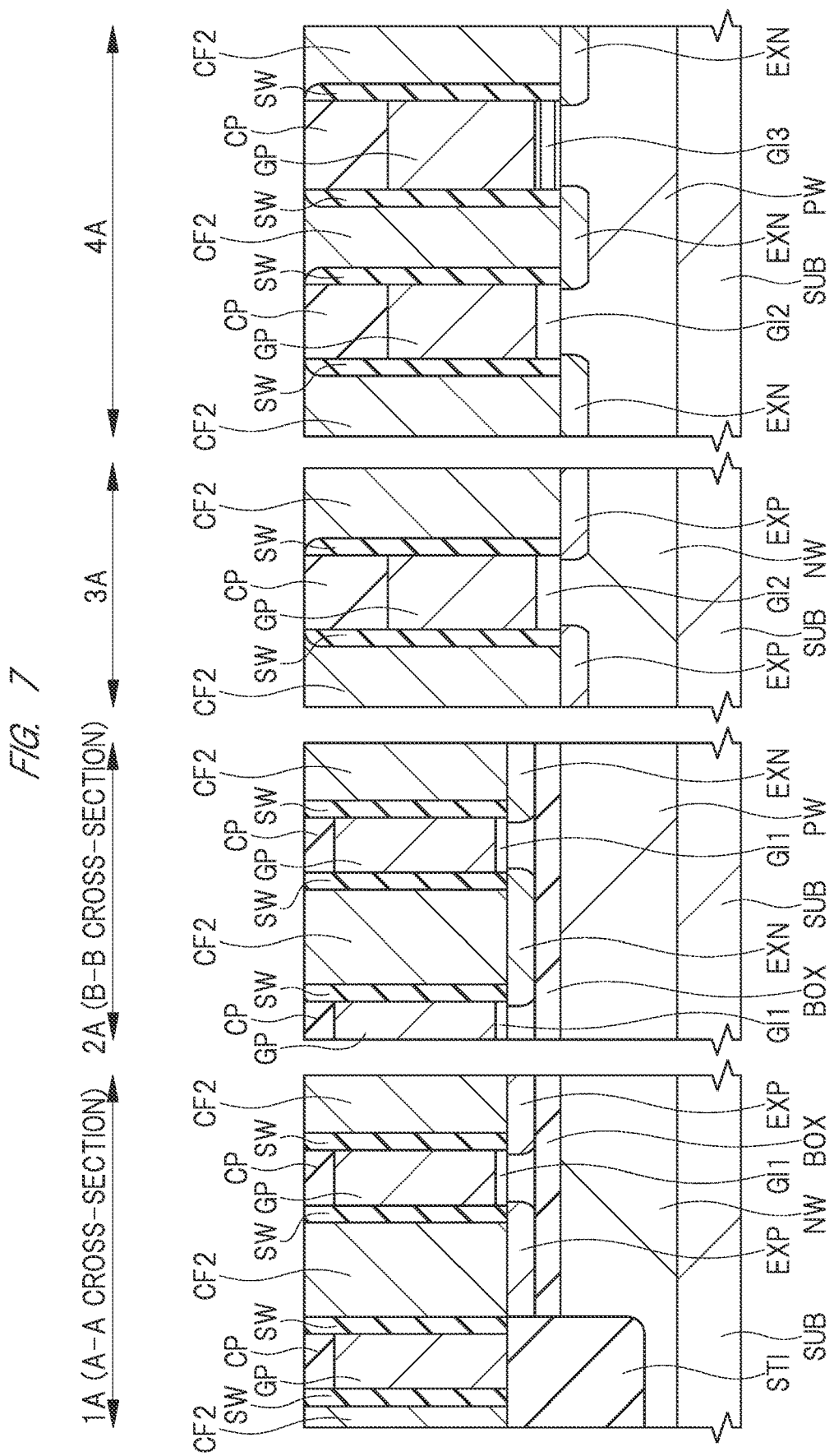
FIG. 7 is a cross-sectional view showing the manufacturing process of the semiconductor device subsequent to FIG. 6.

Next, as shown in FIG. 7, the polishing process is performed to the conductive film CF2 by, for example, the CMP method. This polishing process is performed until the cap films CP are exposed. By the polishing process, the conductive film CF2 is buried in self alignment between the gate patterns GP via the sidewall spacers SW. Also, the insulating film IF2 is removed by this polishing process. Further, in each of the regions 1A to 4A, the extension regions EXP and the extension regions EXN are directly connected to the conductive film CF2.

Figure 8:
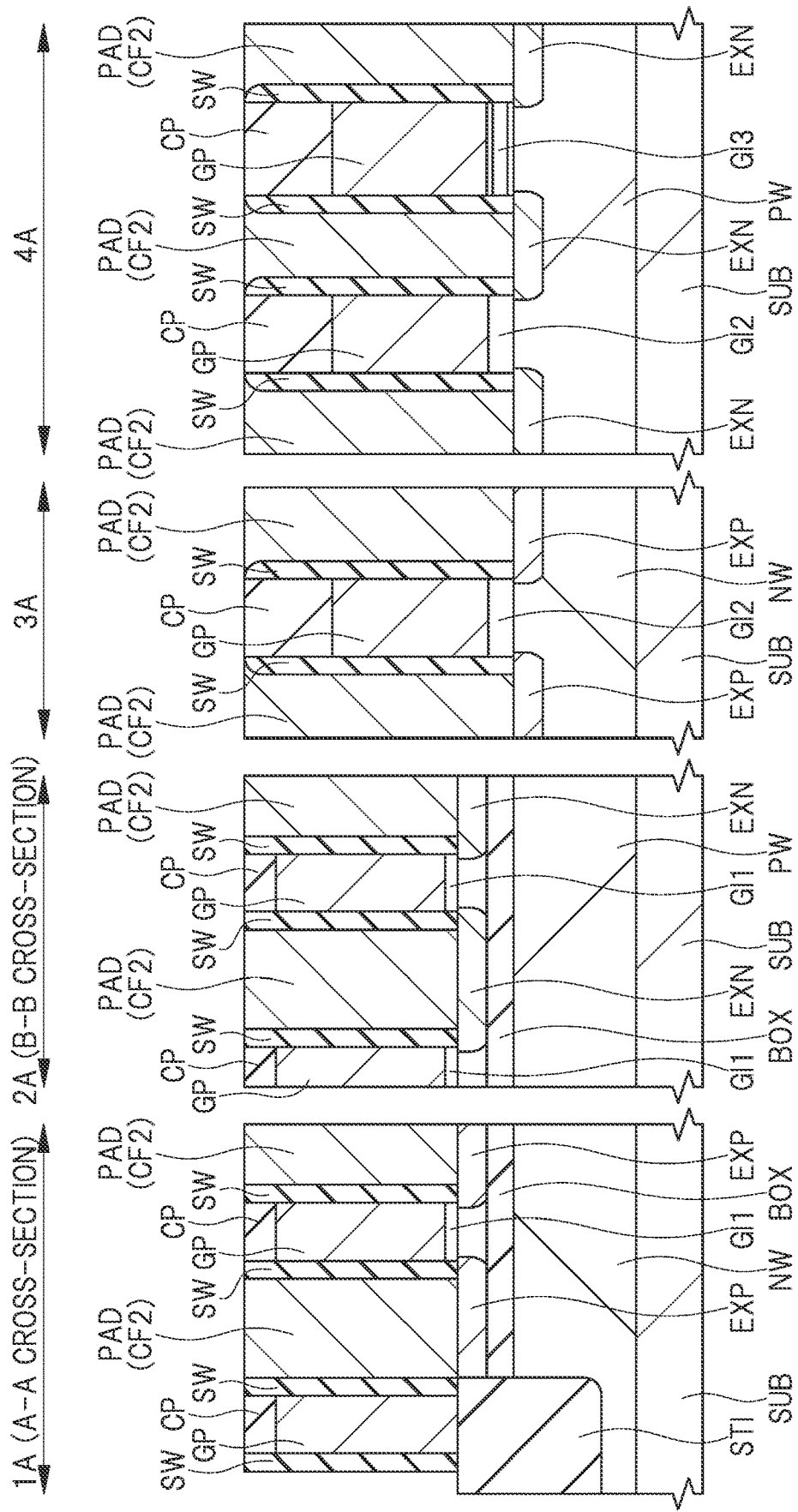
FIG. 8 is a cross-sectional view showing the manufacturing process of the semiconductor device subsequent to FIG. 7.
Figure 9:
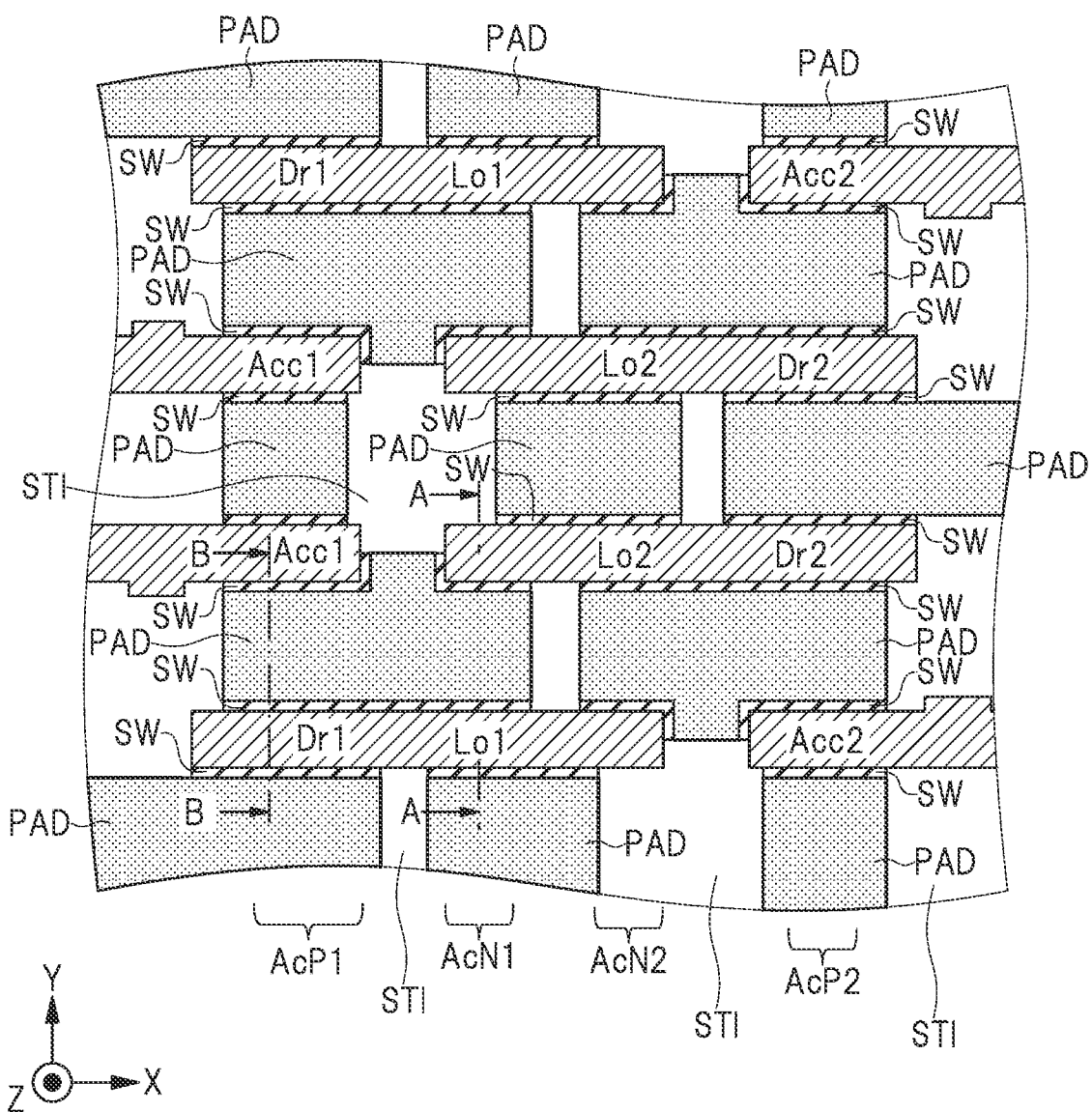
FIG. 9 is a plan view showing the memory cell of the semiconductor device in the state of FIG. 8.

Next, as shown in FIG. 8 and FIG. 9, a part of the conductive film CF2 is patterned by the photolithography technique and the etching process, thereby forming pad layers PAD composed of the remaining conductive film CF2 (that is, a part of the conductive film CF2 remaining without being patterned). At this time, the etching mask by the photolithography technique is located on the cap films CP. Therefore, in the etching process, not only the conductive film CF2 exposed from the etching mask but also the sidewall spacers SW are etched. However, there is no particular problem if the sidewall spacers SW remain without being removed completely. Note that the line A-A and the line B-B shown in FIG. 9 correspond to the positions of the line A-A and the line B-B shown in FIG. 2.

Figure 10:
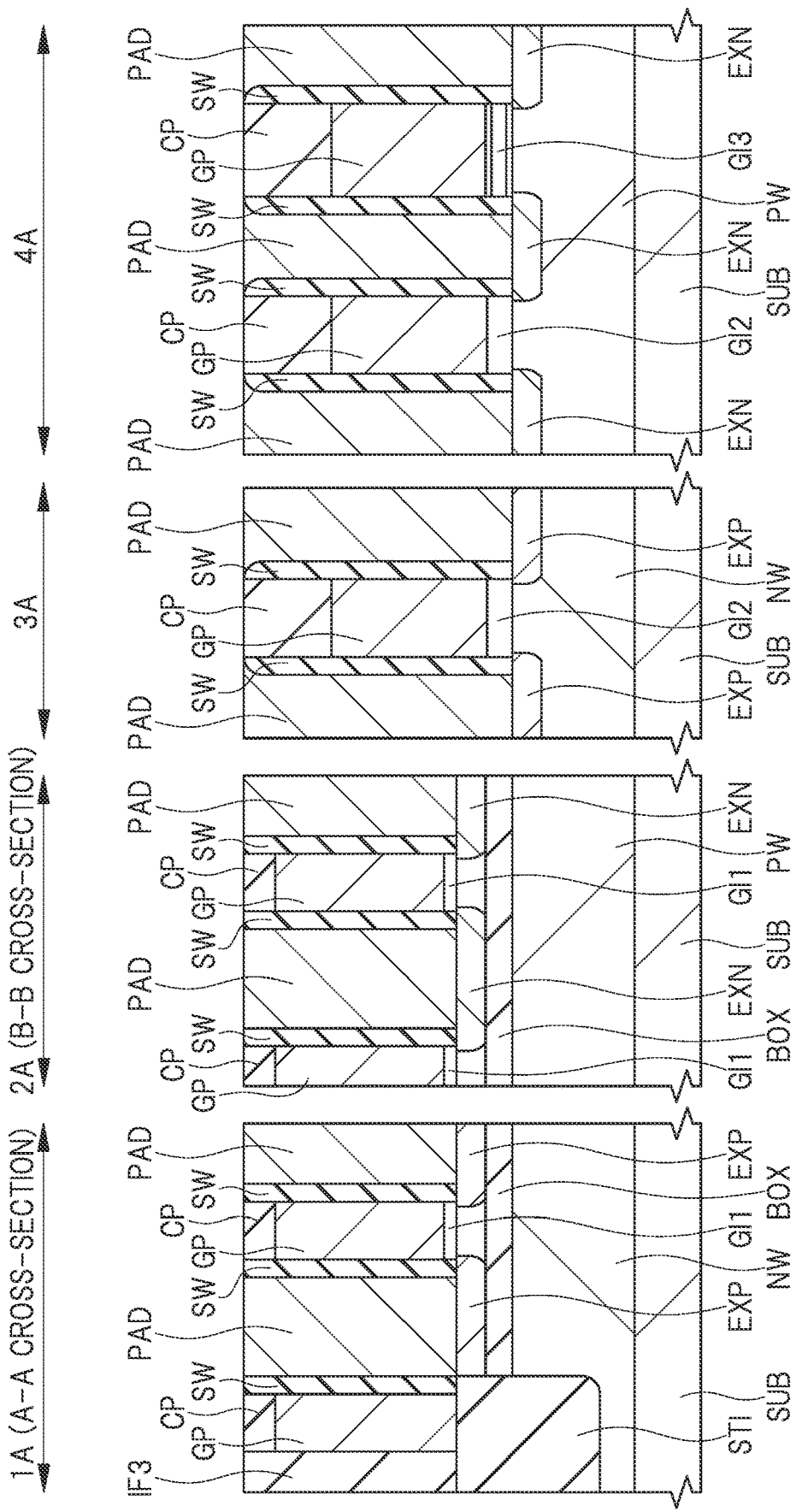
FIG. 10 is a cross-sectional view showing the manufacturing process of the semiconductor device subsequent to FIG. 8.

Next, as shown in FIG. 10, an insulating film IF3 made of, for example, silicon oxide is formed by, for example, the CVD method in each of the regions 1A to 4A. Next, the polishing process is performed to the insulating film IF3 by, for example, the CMP method. This polishing process is performed until the pad layers PAD are exposed. By this polishing process, the portion from where the conductive film CF2 has been removed is filled with the insulating film IF3. Note that the portion from where the conductive film CF2 has been removed is the portion located on the element isolation portion STI. Therefore, the insulating film IF3 is located on the element isolation portion STI.

Figure 11:
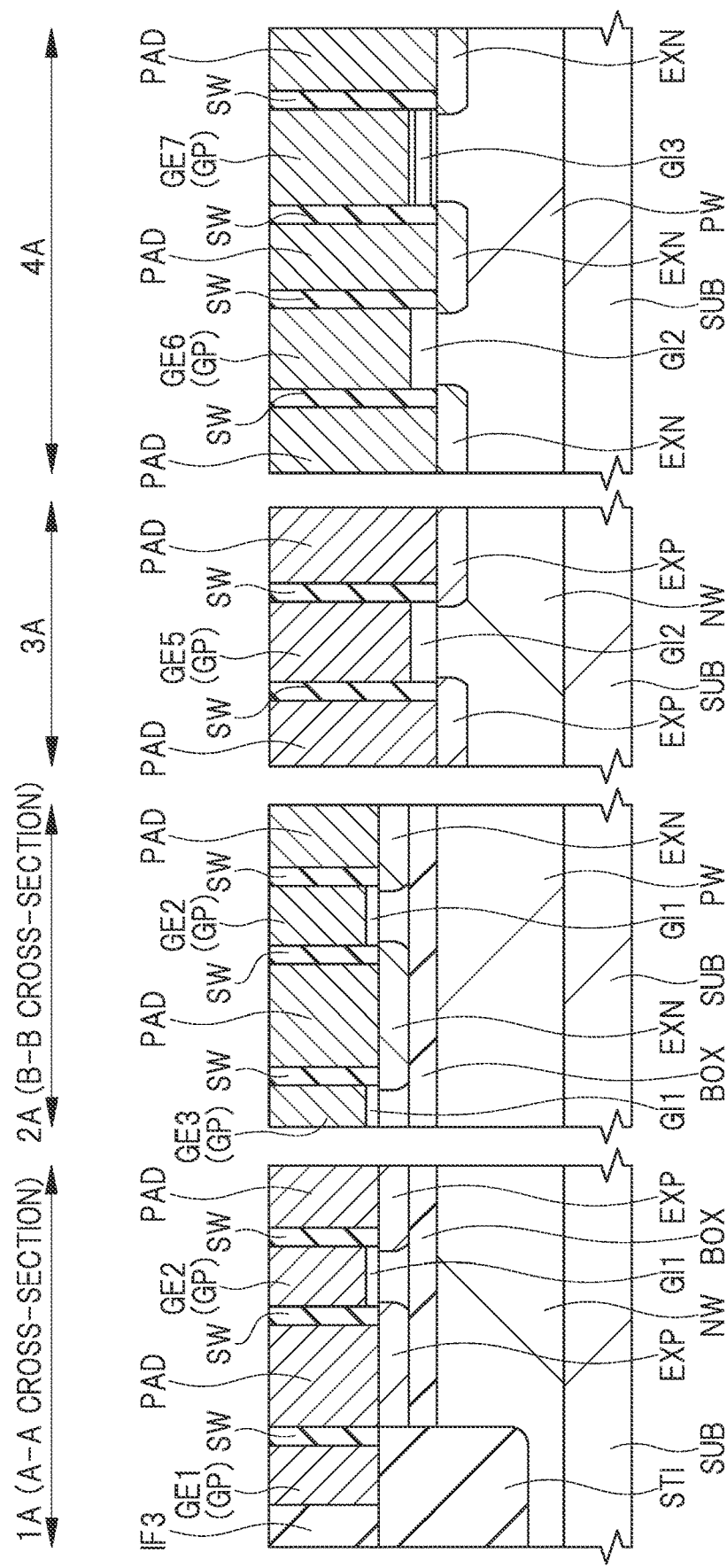
FIG. 11 is a cross-sectional view showing the manufacturing process of the semiconductor device subsequent to FIG. 10.

Next, as shown in FIG. 11, the polishing process is performed to the cap films CP, the sidewall spacers SW, the insulating films IF3, and the pad layers PAD by, for example, the CMP method. This polishing process is performed until the cap films CP are removed and the gate patterns GP are exposed.

Figure 12:
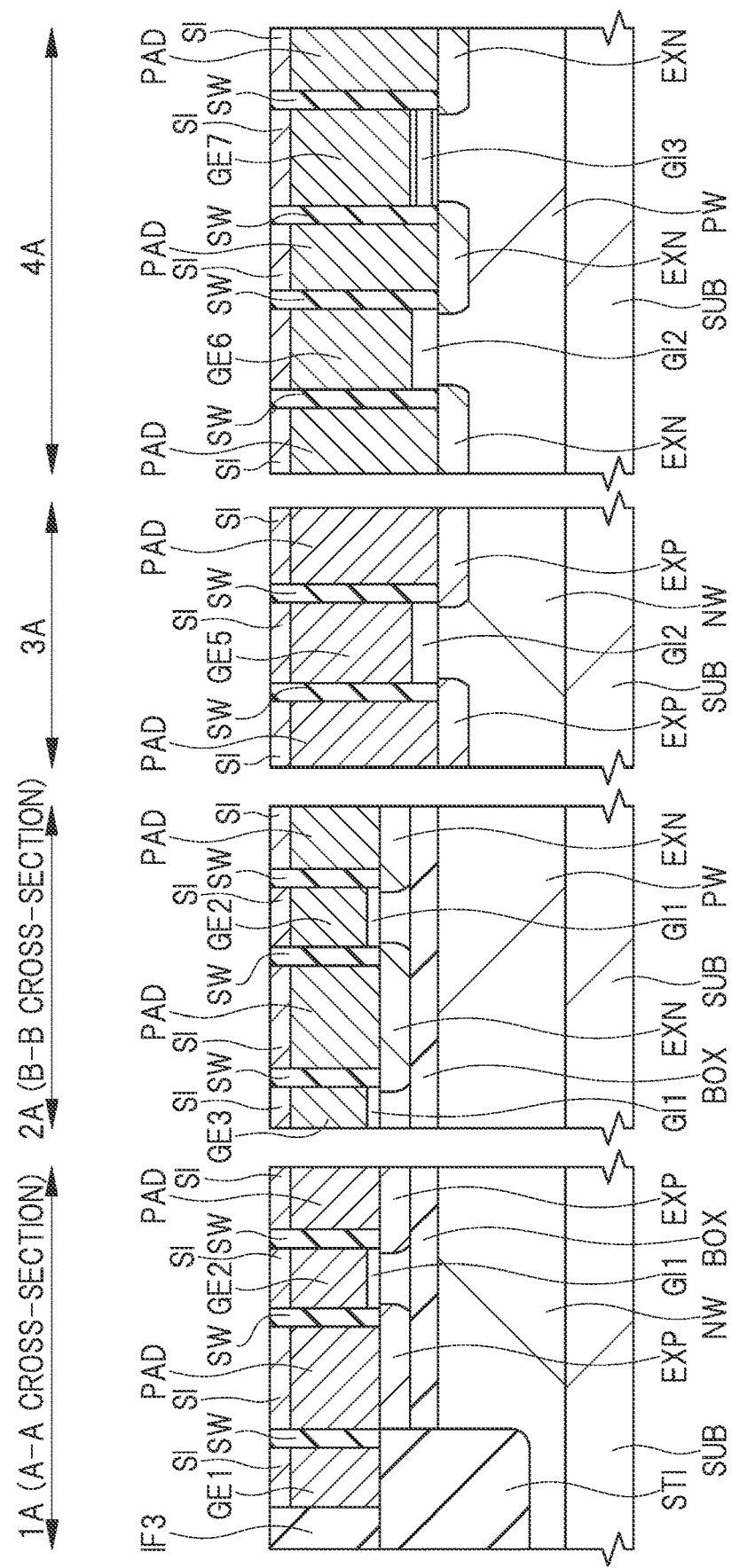
FIG. 12 is a cross-sectional view showing the manufacturing process of the semiconductor device subsequent to FIG. 11.

Next, as shown in FIG. 12, by the photolithography technique and the ion implantation method, impurities are implanted into the gate patterns GP and the pad layers PAD. A p-type impurity is implanted into the gate patterns CP and the pad layers PAD in the region 1A and the region 3A, and an n-type impurity is implanted into the gate patterns GP and the pad layers PAD in the region 2A and the region 4A.

Here, in the memory cell MC (see FIG. 2), a portion of the load transistor Lo2 becomes a p-type and a portion of the driver transistor Dr2 becomes an n-type in the gate electrode GE1. Also, a portion of the load transistor Lo1 becomes a p-type and a portion of the driver transistor Dr1 become an n-type in the gate electrode GE2. In addition, the gate electrodes GE3 and GE4 of the access transistors Acc1 and Acc2 become an n-type. Further, a gate electrode GE5 of the region 3A becomes a p-type and gate electrodes GE6 and GE7 of the region 4A become an n-type.

Also, in each of the regions 1A to 4A, the pad layers PAD in which impurities have been implanted constitute the source region and the drain region of each transistor together with the extension regions EXP and the extension regions EXN.

From the viewpoint that the channeling at the time of ion implantation can be easily prevented, it is preferable that the conductive film CF2 is amorphous silicon at the time of forming the pad layer PAD (conductive film CF2).

Next, in each of the regions 1A to 4A, silicide layer SI is formed on each upper surface of the gate patterns GP and the pad layers PAD by the salicide (Self Aligned Silicide) technique. First, a silicon oxide film is formed by, for example, the CVD method in each of the regions 1A to 4A and a region where other semiconductor elements such as a resistor element are formed. Next, the silicon oxide film is patterned so as to cover only the region to which the silicidation is not performed.

Next, a metal film for forming the silicide layer SI is formed so as to cover the regions 1A to 4A. Then, by performing the thermal treatment to the semiconductor substrate SUB, the materials contained in the gate patterns GP and the pad layers PAD and the metal film are reacted with each other. Consequently, the silicide layer SI is formed on each upper surface of the gate patterns GP and the pad layers PAD. Thereafter, the unreacted metal film is removed. Note that the metal film is made of, for example, cobalt, nickel, or nickel-platinum alloy, and the silicide layer SI is made of, for example, cobalt silicide ($CoSi_2$) nickel silicide (NiSi), or nickel platinum silicide (NiPtSi).

Through the process described above, each transistor is formed in each of the regions 1A to 4A.

Figure 13:
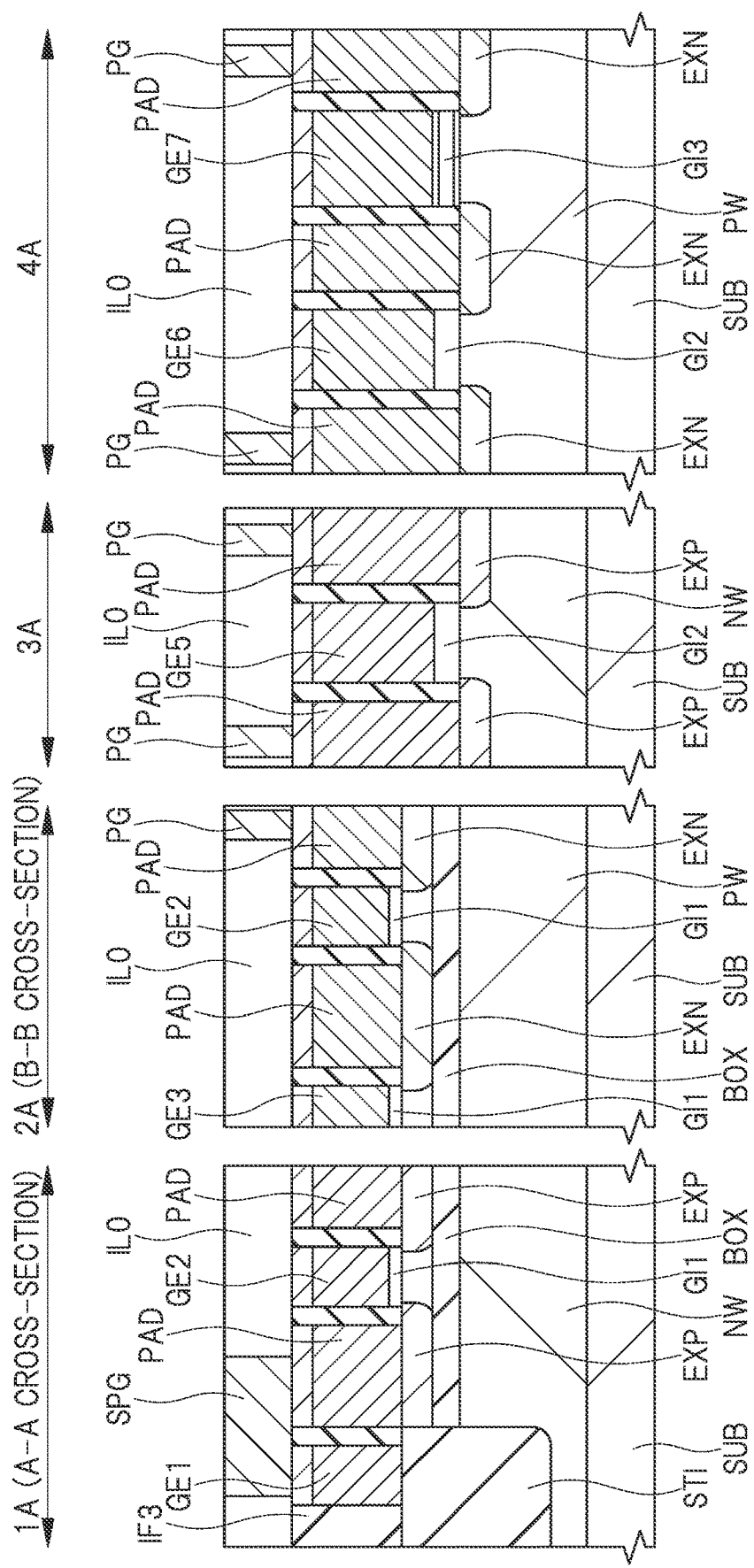
FIG. 13 is a cross-sectional view showing the manufacturing process of the semiconductor device subsequent to FIG. 12.

FIG. 13 shows a process of forming an interlayer film IL0, plugs PG, and shared contact plugs SPG.

First, in each of the regions 1A to 4A, the interlayer insulating film IL0 made of, for example, silicon oxide is formed by, for example, the CVD method on the silicide layers SI and the insulating films IF3 so as to cover each transistor.

Next, by the photolithography technique, the dry etching process, and the like, a plurality of contact holes is formed in the interlayer insulating film IL0, and a plurality of plugs PG is formed in the interlayer insulating film IL0 by filling the contact holes with a stacked film including a barrier metal film and a metal film formed on the barrier metal film. Note that the barrier metal film can be formed by, for example, the CVD method, and is made of, for example, titanium nitride or tungsten nitride. The metal film can be formed by, for example, the CVD method, and is made of, for example, tungsten. Also, the plurality of plugs PG includes the shared contact plug SPG having a planar size larger than the other plugs PG.

For example, as described in FIG. 2 and FIG. 9, the gate pattern GP (gate electrode GE1) in the active region AcN2 extends on the element isolation portion STI so as to be adjacent to the pad layer PAD in the active region AcN1 via the sidewall spacer SW in the active region AcN2.

As shown in FIG. 14, the shared contact plug SPG is connected to both of the gate pattern GP (gate electrode GE1) in the active region AcN2 and the pad layer PAD in the active region AcN1.

Next, an interlayer insulating film IL1 is formed on the interlayer insulating film IL0 in which the plurality of plugs PG has been buried. Then, after forming wiring trenches in the interlayer insulating film IL1, a conductive film composed mainly of for example, copper is buried in the wiring trenches, thereby forming in the interlayer insulating film IL a plurality of wirings M1 connected to the plurality of plugs PG. The structure of the wirings M1 is the so-called damascene wiring structure.

Figure 15:
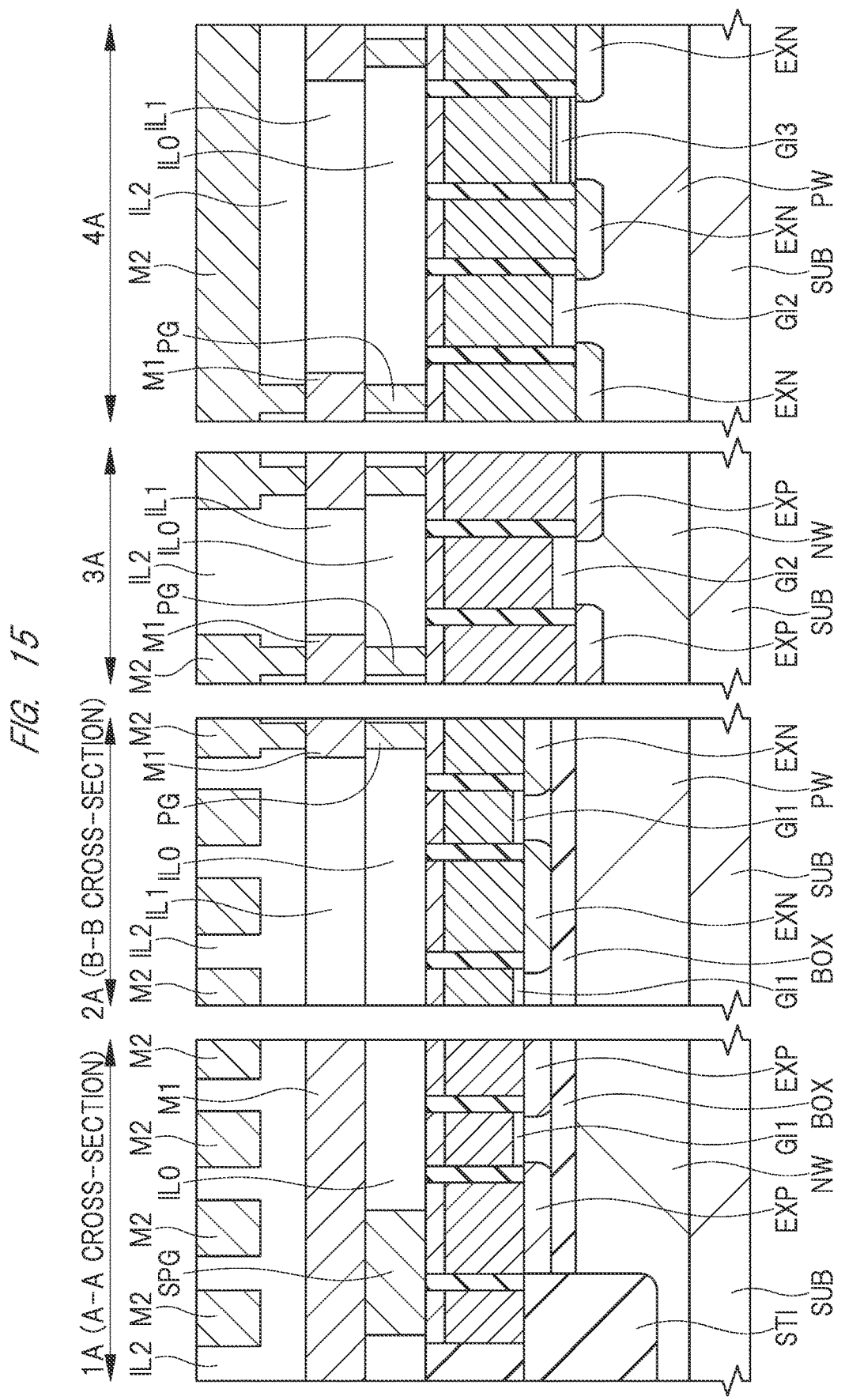
FIG. 15 is a cross-sectional view showing the manufacturing process of the semiconductor device subsequent to FIG. 13.

Next, as shown in FIG. 15, an interlayer insulating film IL2 is formed on the interlayer insulating film IL1 in which the plurality of wirings M1 has been buried. Then, after forming holes and wiring trenches in the interlayer insulating film IL2, a conductive film composed mainly of, for example, copper is buried in the holes and trenches, thereby forming in the interlayer insulating film IL2 a plurality of wirings M2 connected to the plurality of wirings M1. The structure of the wirings M2 is the so-called dual damascene wiring structure. Thereafter, the wirings of the third and subsequent layers are formed, but the illustration and description thereof are omitted here.

Through the process described above, the semiconductor device according to the first embodiment is manufactured.

As described above, in the semiconductor device using the SOI substrate, if the position of the contact hole is misaligned, the contact hole penetrates the element isolation portion STI, and the defect that the source region and the drain region formed in the semiconductor layer SL and the well region formed in the semiconductor substrate SUB are short-circuited via the plug formed in the contact hole may occur in some cases.

In the first embodiment, the pad layer PAD is formed on the semiconductor layer SL, and thus such a defect is less likely to occur. Namely, even if the position of the plug PG is misaligned with the pad layer PAD, since the insulating film IF3 is formed in the portion in which the pad layer PAD is not present the contact hole (plug PG) is less likely to reach the element isolation portion STI.

Also, in the case of forming the epitaxial layer on the semiconductor layer SL, it is difficult to stably grow the epitaxial layer and the shape of the epitaxial layer becomes unstable in many cases. In the first embodiment, the pad layer PAD can be formed by the CVD method, and the shape can be stable by means of the patterning. Also, since the conductive film CF2 is buried in self alignment between the gate patterns GP via the sidewall spacers SW, the pad layer PAD can be easily formed.

As described above, according to the first embodiment, the reliability of the semiconductor device can be improved by the application of the pad layer PAD.

Further, in the memory cell MC, the plug PG connected to both of the gate pattern GP and the pad layer PAD like the shared contact plug SPG is also present. However, since the height of the gate pattern GP and the height of the pad layer PAD are the same, there is almost no difference in height between the gate pattern GP and the impurity regions (source region, drain region). Therefore, the shared contact plug SPG can be easily formed, and the gate pattern GP and the pad layer PAD (source region, drain region) can be easily connected. Accordingly, the reliability of the semiconductor device can be further improved.

Further, as shown in FIG. 14, of the plurality of pad layers PAD formed in the memory cell MC, a pad layer PAD1 corresponds to the node N1 FIG. 1, a pad layer PAD2 corresponds to the node N2 in FIG. 1, and a pad layer PAD3 corresponds to the reference voltage Vss in FIG. 1. Namely, the extension region EXN in the active region AcP2 and the extension region EXP in the active region AcN2 are connected by the same pad layer PAD1, and the extension region EXN in the active region AcP1 and the extension region EXP in the active region AcN1 are connected by the same pad layer PAD2. Also, the pad layer PAD3 is used in common in the four memory cells MC.

In the conventional case, the wiring M1 or the like is used as the structure corresponding to these pad layers PAD1 to PAD3. In the first embodiment, the pad layers PAD1 to PAD3 can be used as local wirings, and thus the wiring in one layer for the wire connection of the memory cell MC can be omitted. Therefore, since the omitted wiring can be used for the wire connection of other circuits, the degree of freedom of the wiring design can be improved.

Figure 16:
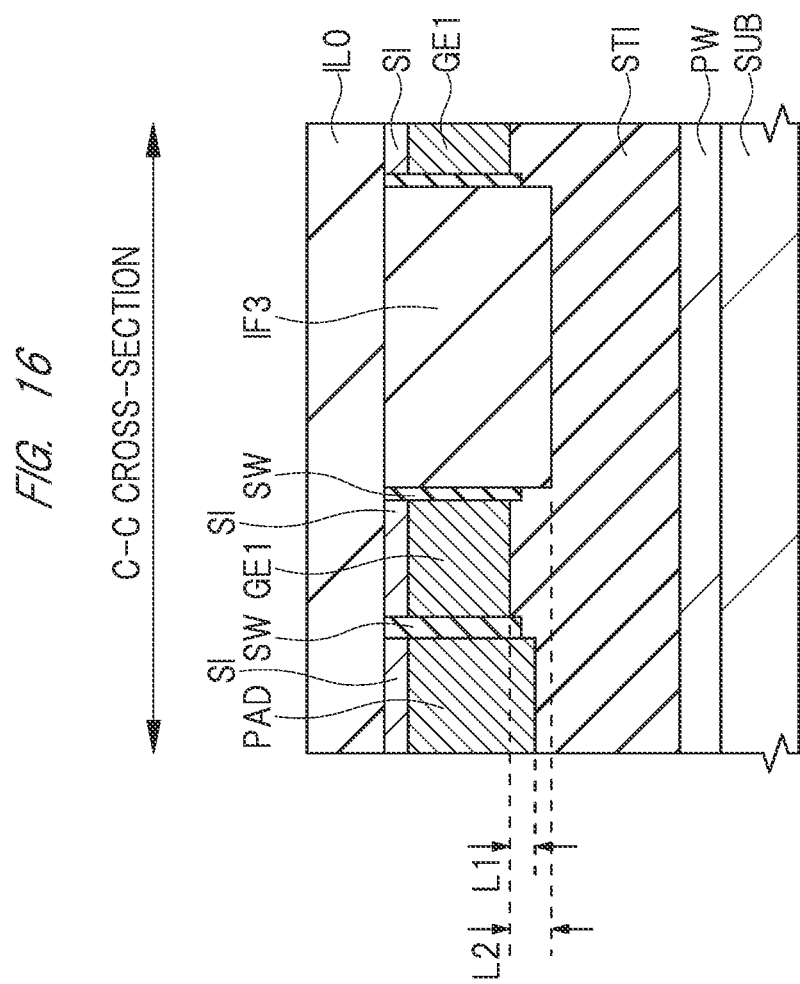
FIG. 16 is a cross-sectional view showing another part of the semiconductor device in the state of FIG. 13.

FIG. 16 shows a structural feature of the semiconductor device according to the first embodiment, and is a cross-sectional view along a line C-C (straight line) in FIG. 2. As shown in FIG. 16, the position of the lower surface of the gate electrode GE1 (gate pattern GP) is higher than the position of the lower surface of the pad layer PAD and the position of the lower surface of the insulating film IF3. Also, as shown in FIG. 16, the position of the lower surface of the pad layer PAD is higher than the position of the lower surface of the insulating film IF3. In other words, a distance L1 from the position of the lower surface of the gate electrode GE1 to the position of the lower surface of the pad layer PAD is smaller than a distance L2 from the position of the lower surface of the gate electrode GE1 to the position of the lower surface of the insulating film IF3.

As the main factor of the occurrence of such a difference, the etching process for forming the sidewall spacers SW in FIG. 5 and the etching process for patterning the conductive film CF2 in FIG. 8 can be presented. The upper surface of the element isolation portion STI corresponding to the lower surface of the insulating film IF3 recedes not only by the etching process in FIG. 5 but also by the etching process in FIG. 8.

Also, the sidewall spacer SW between the gate electrode GE1 and the insulating film IF3 is eliminated or thinned by the etching process in FIG. 8 as compared with the sidewall spacer SW between the gate electrode GE1 and the pad layer PAD.

Second Embodiment

A method of manufacturing a semiconductor device according to the second embodiment will be described below with reference to FIG. 17 to FIG. 25. In the following description, the difference from the first embodiment will be mainly described.

In the first embodiment described above, the gate electrodes GE1 to GE5 are formed by implanting impurities into the gate patterns GP made of silicon. In the second embodiment, the gate electrodes GE1 to GE5 are formed by replacing the gate patterns GP made of silicon with a metal film.

Figure 17:
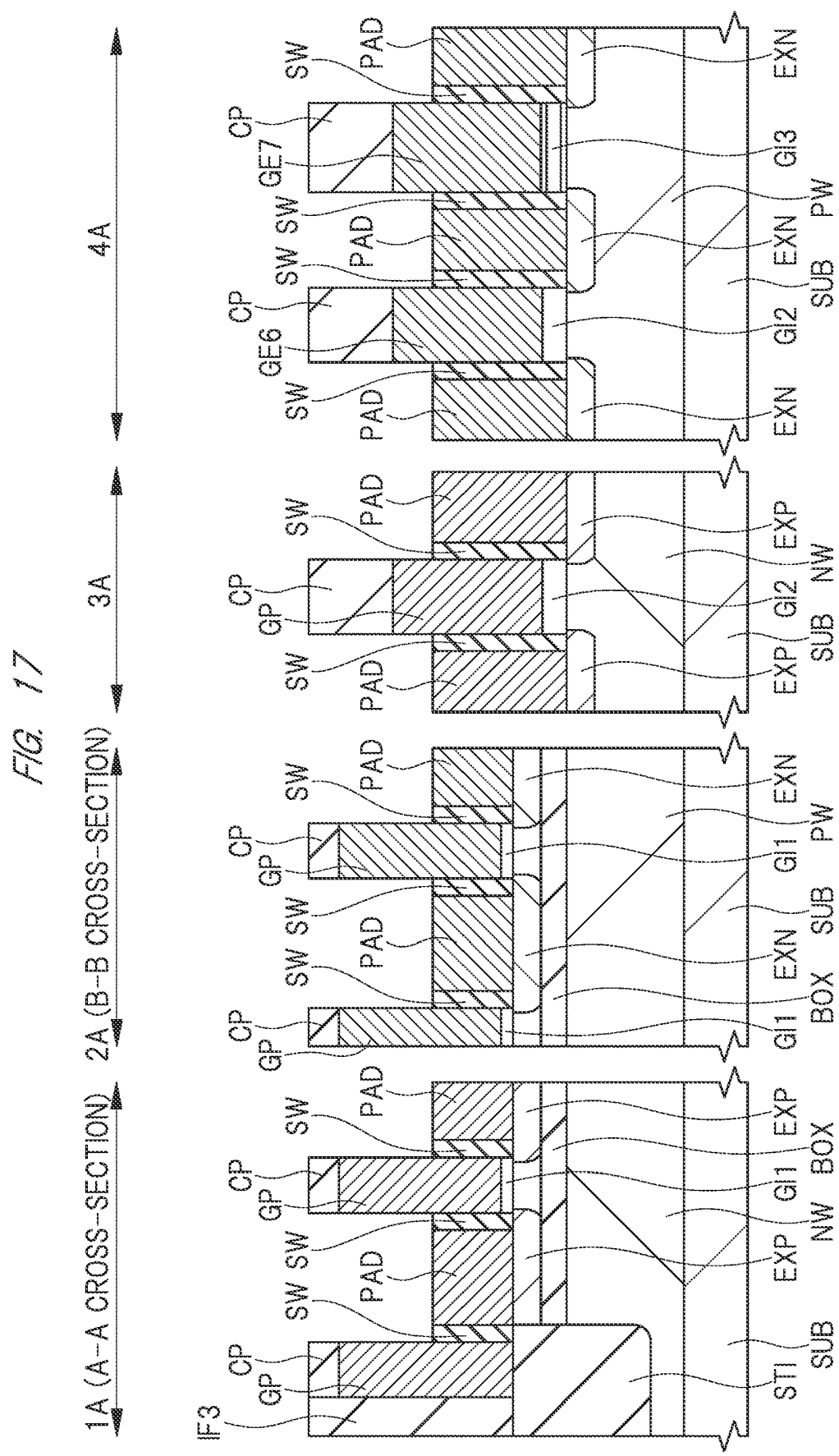
FIG. 17 is a cross-sectional view showing a manufacturing process of a semiconductor device according to the second embodiment.

In the second embodiment, the manufacturing process from FIG. 3 to FIG. 10 is the same as that of the first embodiment. FIG. 17 shows the manufacturing process subsequent to FIG. 10.

First, as shown in FIG. 17, the dry etching process is performed under the condition that the silicon oxide film is hard to be etched, and the upper surfaces of the pad layers PAD are made to selectively recede such that the upper surfaces of the pad layers PAD are lower than the upper surfaces of the gate patterns GP. At this time, the sidewall spacers SW are also etched together with the pad layers PAD.

Next, by the photolithography technique and the ion implantation method, impurities are implanted into the gate patterns GP and the pad layers PAD. A p-type impurity is implanted into the gate patterns GP and the pad layers PAD in the region 1A and the region 3A, and an n-type impurity is implanted into the gate patterns GP and the pad layers PAD in the region 2A and the region 4A. Consequently, the gate patterns of the region 4A become the n-type gate electrodes GE6 and GE7.

Figure 18:
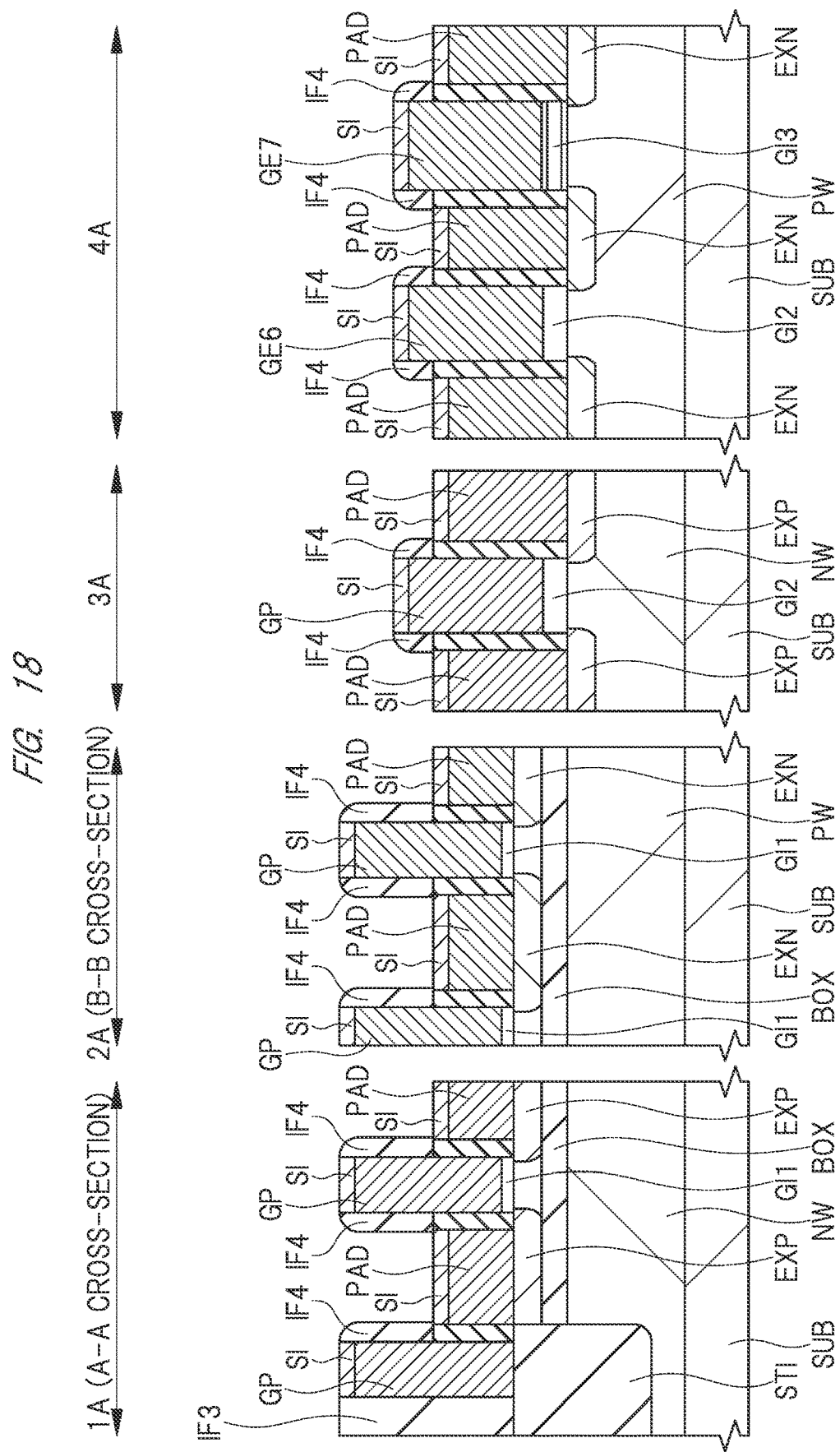
FIG. 18 is a cross-sectional view showing the manufacturing process of the semiconductor device subsequent to FIG. 17.

Next, as shown in FIG. 18, an insulating film IF4 made of, for example, silicon oxide is formed by, for example, the CVD method on the pad layers PAD so as to cover the gate patterns GP, the cap films CP, and the sidewall spacers SW.

Next, by performing the anisotropic etching process to the insulating film IF4 and the cap films CP, the cap films CP are removed, and the insulating film IF4 is left on the side surfaces of the gate patterns GP as sidewall spacers.

Next, the silicide layer SI is formed on each of the upper surfaces of the gate patterns GP and the upper surfaces of the pad layers PAD exposed from the insulating films IF4 in the shape of the sidewall spacers by the same method as that described above with reference to FIG. 12.

Figure 19:
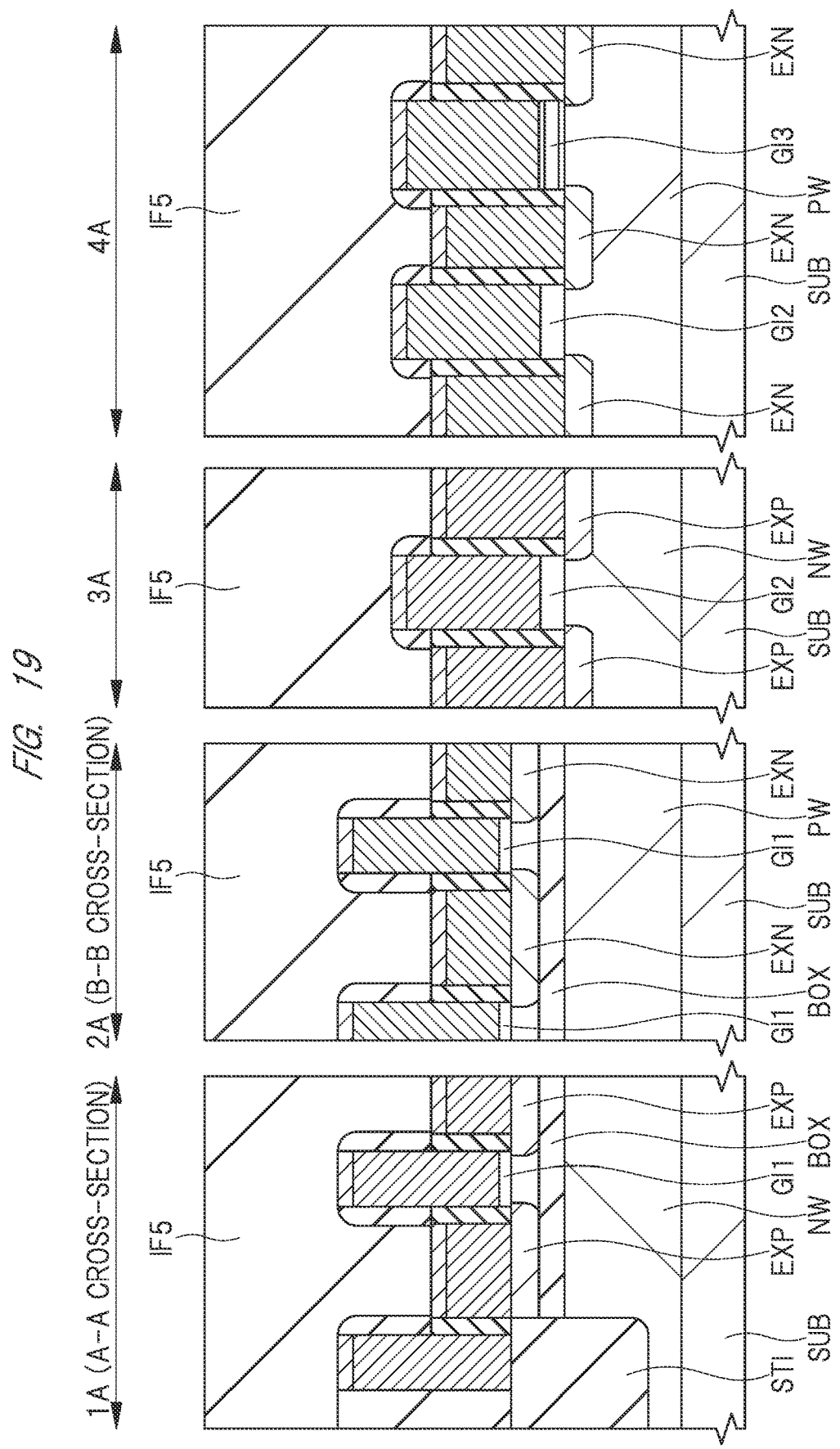
FIG. 19 is a cross-sectional view showing the manufacturing process of the semiconductor device subsequent to FIG. 18.

Next, as shown in FIG. 19, an insulating film IF5 made of, for example, silicon oxide is formed by, for example, the CVD method on the silicide layers SI formed on the upper surfaces of the gate patterns GP and the upper surfaces of the pad layers PAD.

Figure 20:
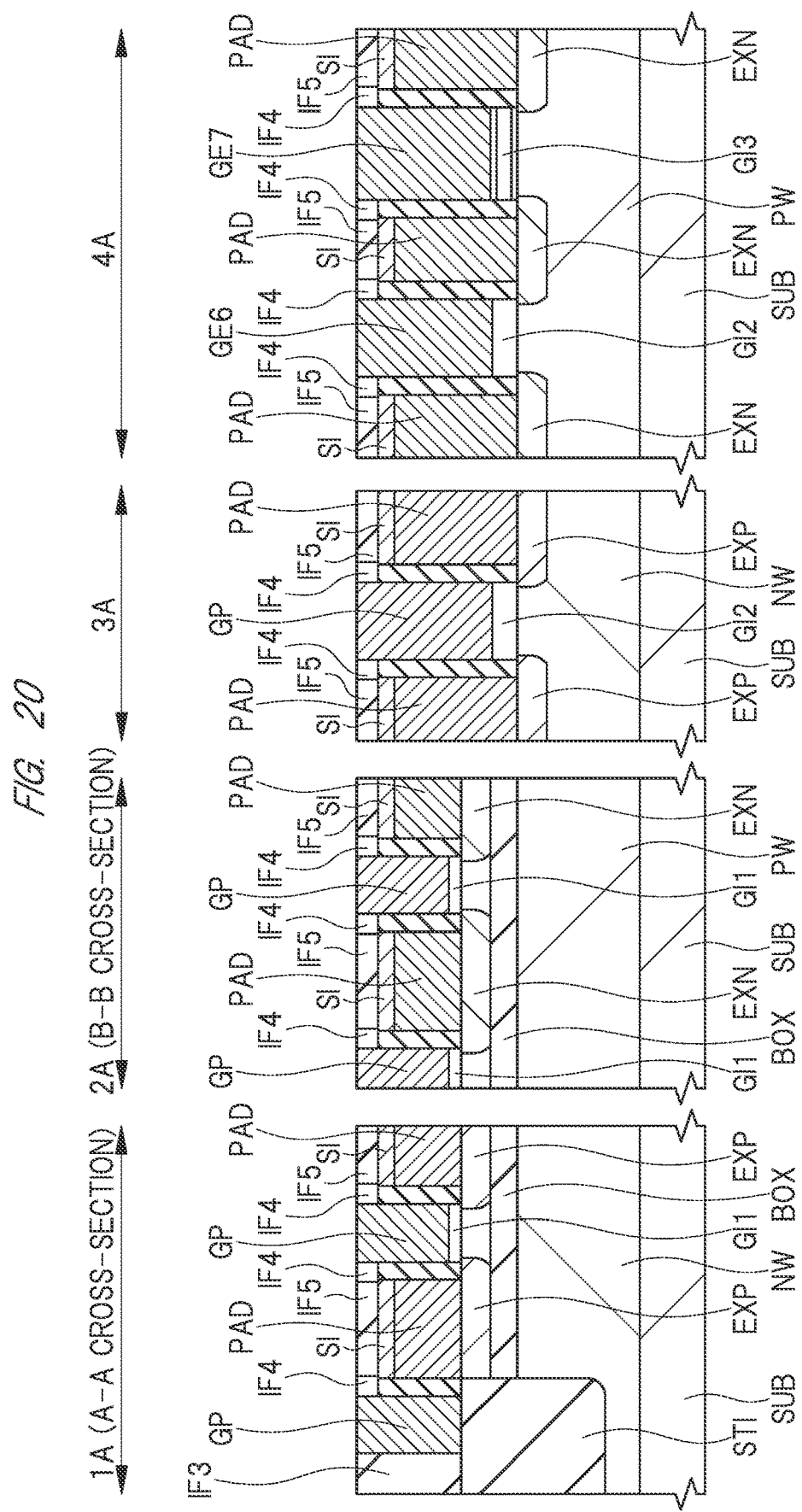
FIG. 20 is a cross-sectional view showing the manufacturing process of the semiconductor device subsequent to FIG. 19.

Next, as shown in FIG. 20, the polishing process is performed to the insulating film IF5. This polishing process is performed such that the silicide layers SI formed on the upper surfaces of the pad layers PAD are covered with the insulating film IF5 and the silicide layers SI formed on the upper surfaces of the gate patterns GP are removed. In addition, the gate patterns GP are partially polished and the height of the gate patterns GP is lowered.

Figure 21:
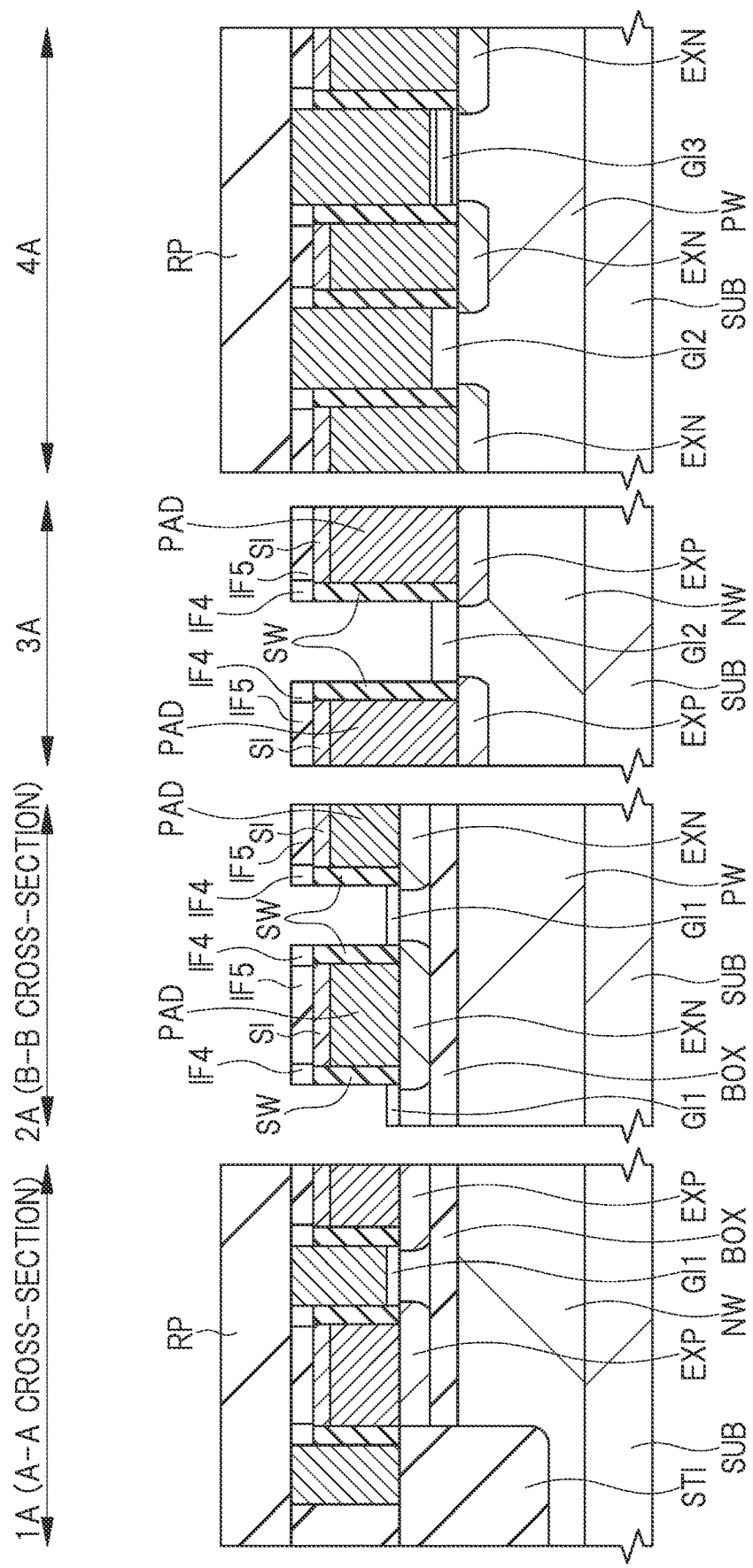
FIG. 21 is a cross-sectional view showing the manufacturing process of the semiconductor device subsequent to FIG. 20.

Next, as shown in FIG. 21, a resist pattern RP having a pattern that covers the region 1A and the region 4A and opens the region 2A and the region 3A is formed. Next, the etching process is performed under the condition that the silicon oxide film is hard to be etched, with using the resist pattern RP as a mask, thereby removing the gate patterns GP in the region 2A and the region 3A. Thereafter, the resist pattern RP is removed by the ashing process or the like.

Figure 22:
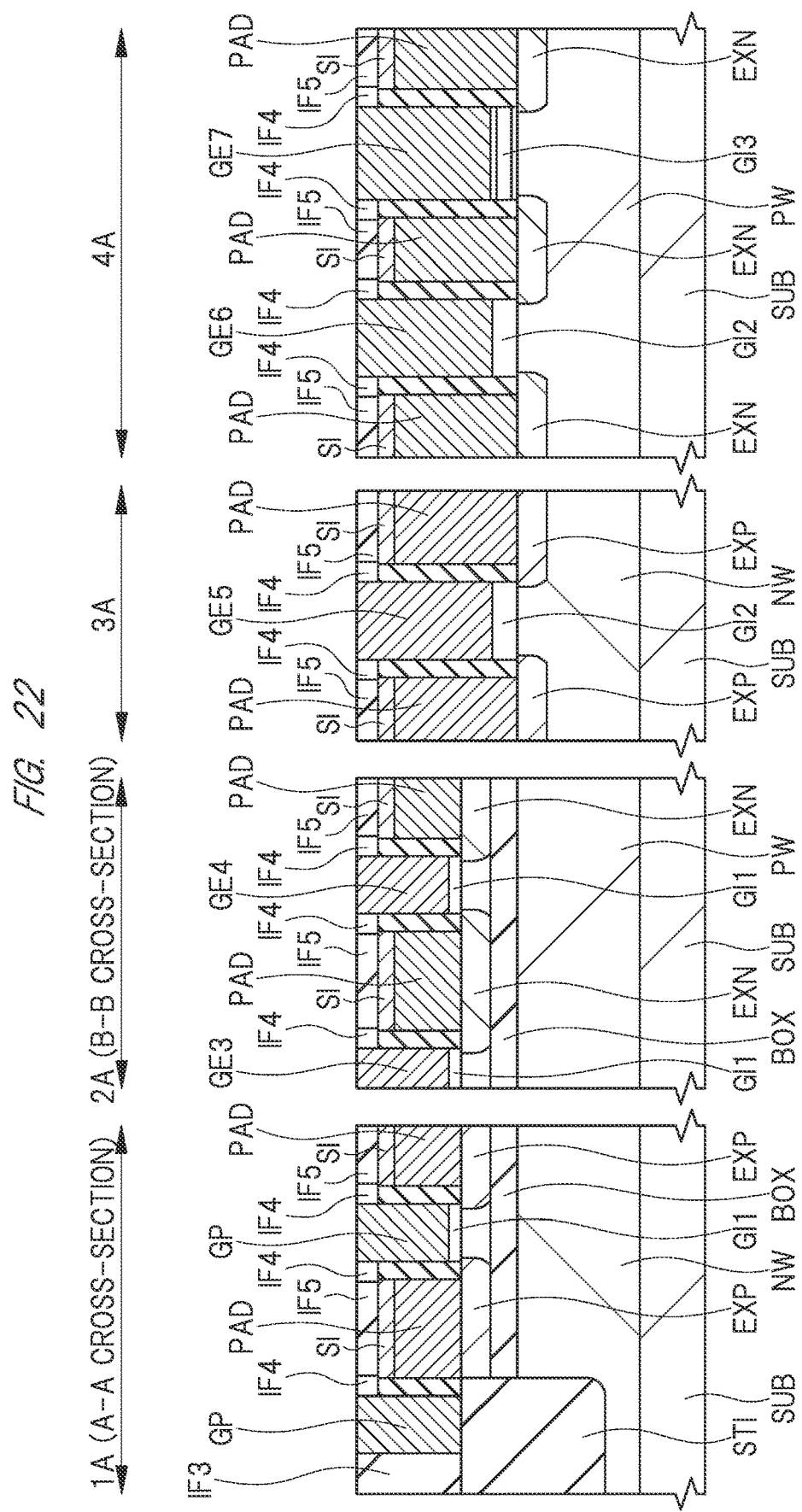
FIG. 22 is a cross-sectional view showing the manufacturing process of the semiconductor device subsequent to FIG. 21.

Next, as shown in FIG. 22, a metal film is deposited by, for example, the sputtering method or the CVD method so as to fill the portions from where the gate patterns GP have been removed. Then, the metal film other than the buried metal film is removed by the CMP process. In this manner, in the region 2A and the region 3A, the gate patterns GP are replaced with the gate electrodes GE3 to GE5 made of a metal film.

Figure 23:
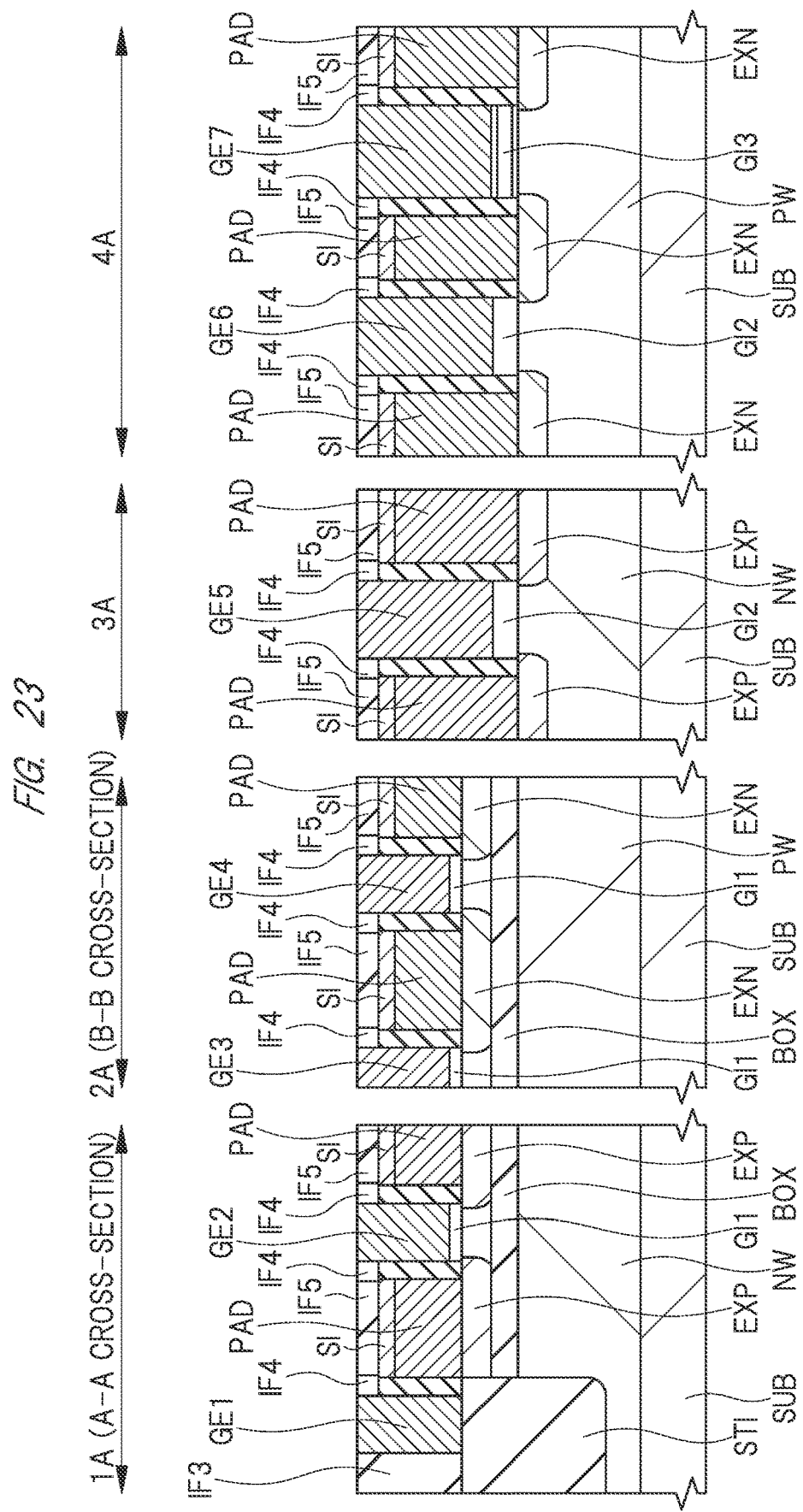
FIG. 23 is a cross-sectional view showing the manufacturing process of the semiconductor device subsequent to FIG. 22.

Next, as shown in FIG. 23, the same process is performed to the region 1A. Namely, the gate patterns GP in the region 1A are removed with using a resist pattern having a pattern that covers the regions 2A to 4A and opens the region 1A as a mask. Thereafter, the portions from where the gate patterns GP have been removed are filled with a metal film, thereby forming the gate electrodes GE1 and GE2 made of the metal film.

In this manner, in the regions 1A to 3A, the gate patterns GP are removed and the portions from where the gate patterns GP have been removed are filled with a metal film, whereby the gate electrodes GE1 to GE5 made of the metal film are formed.

Note that the metal film mentioned above is made of a single metal film such as a tantalum nitride film, a titanium aluminum film, a titanium nitride film, a tungsten film, or an aluminum film or a stacked film in which these films are stacked as appropriate. Further, as the metal film used for a p-type transistor or an n-type transistor, a suitable material can be selected as appropriate in consideration of the characteristics of each transistor.

Though not shown here, it is also possible to form a high-dielectric-constant film before depositing the metal film so as to use the high-dielectric-constant film as a part of the gate insulating film of each transistor. The high-dielectric-constant film is an insulating film having a dielectric constant higher than that of a silicon oxide film, and is made of, for example, hafnium oxide (HfO) or hafnium silicate (HfSiO).

Figure 24:
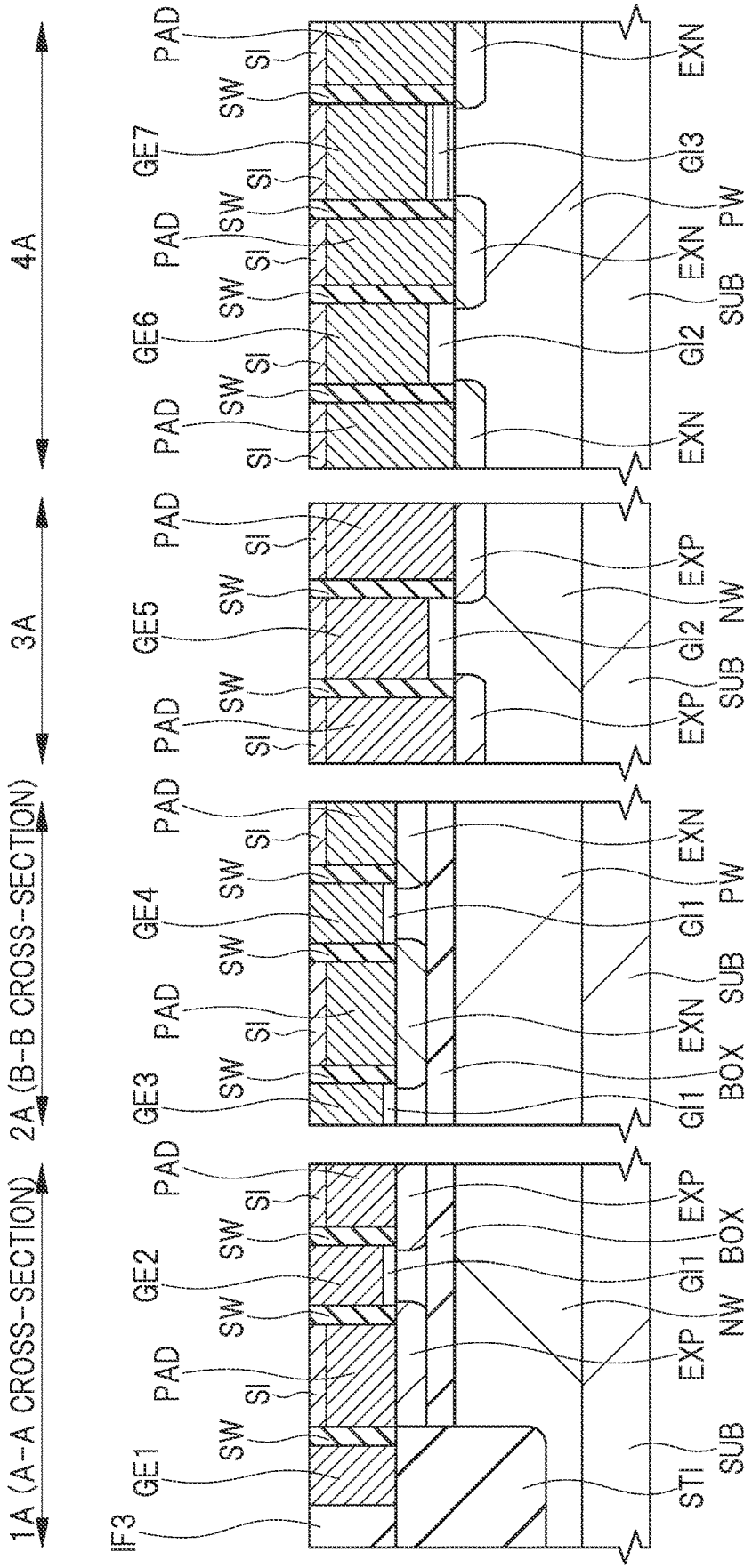
FIG. 24 is a cross-sectional view showing the manufacturing process of the semiconductor device subsequent to FIG. 23.

Next, as shown in FIG. 24, the silicide layers SI are selectively formed on each upper surface of the gate electrodes GE6 and GE7 in the region 4A by the same method as that described above with reference to FIG. 12.

Figure 25:
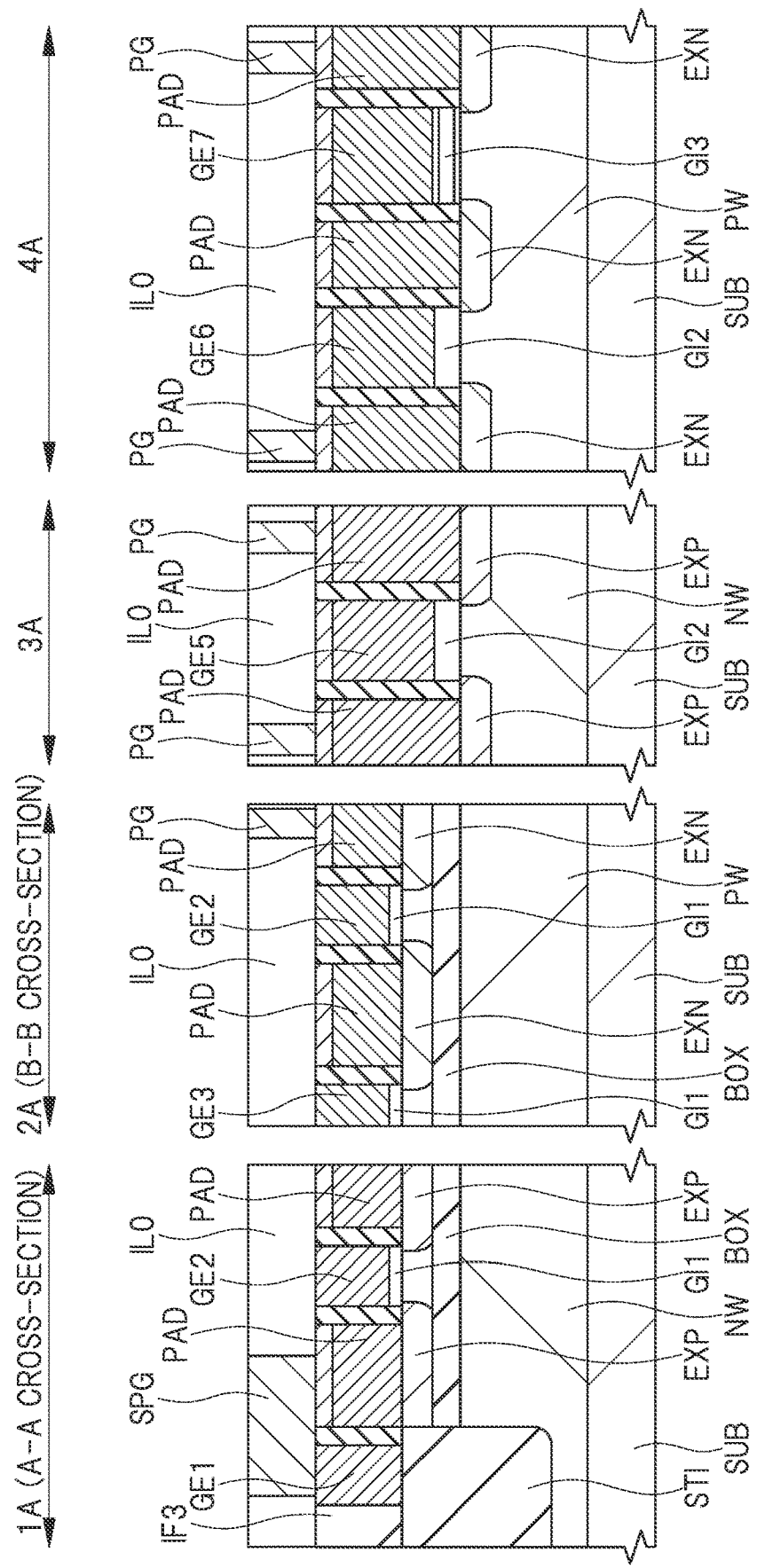
FIG. 25 is a cross-sectional view showing the manufacturing process of the semiconductor device subsequent to FIG. 24.

Next, as shown in FIG. 25, the interlayer insulating film IL0, the plug PG, and the shared contact plugs SPG are formed. The arrangement of the plugs PG and the shared contact plugs SPG in the memory cell MC is the same as that shown in FIG. 14. Also, the subsequent manufacturing process is the same as that shown in FIG. 16 of the first embodiment.

As described above, the same effect as that of the first embodiment can be achieved even when the gate electrodes GE1 to GE5 are formed by replacing the gate patterns GP made of silicon with the metal film.

Third Embodiment

A method of manufacturing a semiconductor device according to the third embodiment will be described below with reference to FIG. 26. In the following description, the difference from the second embodiment will be mainly described.

In the second embodiment described above, the memory cell MC of the SRAM circuit is formed on the SOI substrate. In the third embodiment, the memory cell MC is formed in a bulk region (semiconductor substrate SUB in which the semiconductor layer SL and the insulating layer BOX have been removed). FIG. 26 is a cross-sectional view along the line A-A and the line B-B shown in FIG. 2.

The method of manufacturing the semiconductor device according to the third embodiment is the same as that of the second embodiment except that the bulk regions are formed by removing the semiconductor layer SL and the insulating layer BOX in the region 1A and the region 2A as in the region 3A and the region 4A in FIG. 3.

Figure 26:
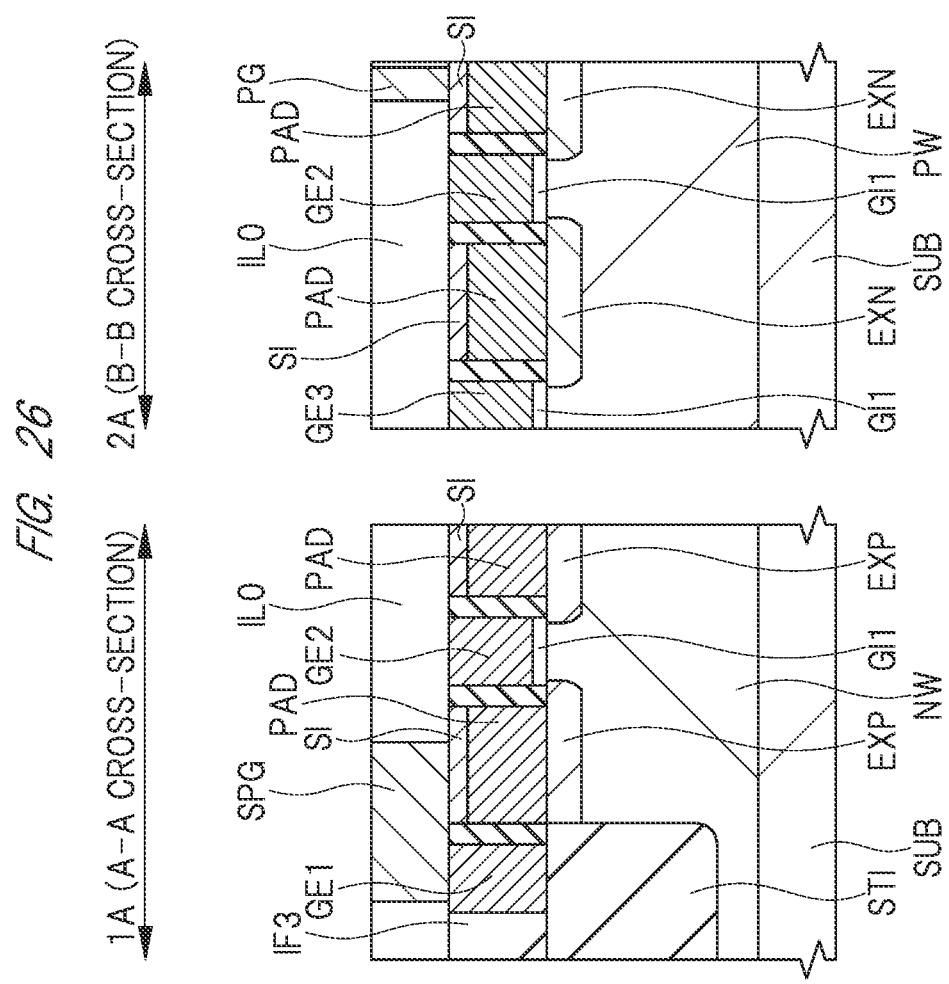
FIG. 26 is a cross-sectional view showing a semiconductor device according to the third embodiment.

In FIG. 26, the case where a metal film is applied as the gate electrodes GE1 to GE5 as in the second embodiment is shown as an example, but the gate electrodes GE1 to GE5 may be formed by implanting impurities into the gate patterns GP made of silicon as in the first embodiment.

(First Modification)

A method of manufacturing a semiconductor device according to the first modification of the third embodiment will be described below with reference to FIG. 27. In the following description, the difference from the third embodiment will be mainly described.

In the third embodiment described above, the pad layer PAD is made of silicon to which an impurity is implanted, and constitutes a part of a source region or a drain region. Also, the silicide layer SI is formed on the upper surface of the pad layer PAD.

Figure 27:
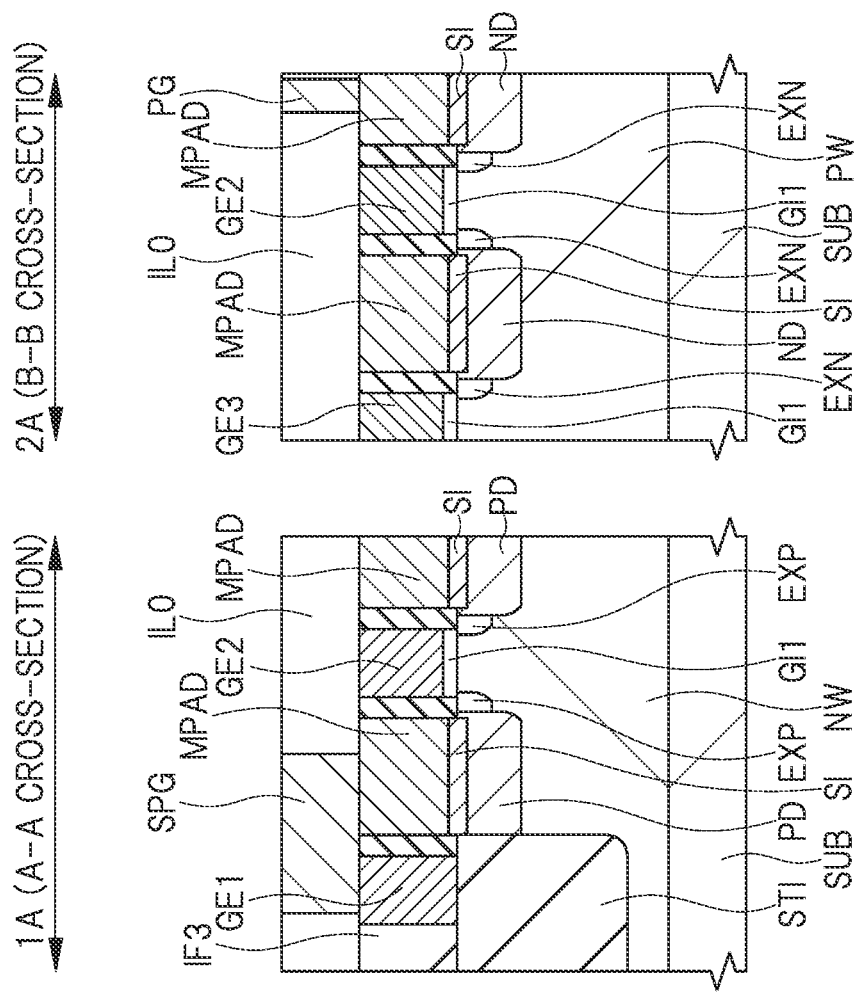
FIG. 27 is a cross-sectional view showing a semiconductor device according to the first modification.

In the first modification, as shown in FIG. 27, a metal pad layer MPAD is formed instead of the pad layer PAD. Further, diffusion regions (impurity regions) PD and ND having an impurity concentration higher than those of the extension regions EXP and EXN are formed in the semiconductor substrate SUB, and the diffusion regions PD and ND constitute a part of the source region or the drain region together with the extension regions EXP and EXN. Then, the silicide layer SI is formed on each upper surface of the diffusion regions PD and ND.

The process of forming the diffusion regions PD and ND is performed between the process of forming the sidewall spacers SW in FIG. 5 and the process of forming the conductive film CF2 in FIG. 6. Namely, by the photolithography technique and the ion implantation method, impurities are implanted into the semiconductor substrate SUB located on both sides of the gate patterns GP via the sidewall spacers SW.

Consequently, the p-type diffusion regions PD are formed in the semiconductor substrate SUB in the region 1A, and the n-type diffusion regions ND are formed in the semiconductor substrate SUB in the region 2A. Though not shown, the p-type diffusion regions PD are formed in the semiconductor substrate SUB in the region 3A, and the n-type diffusion regions ND are formed in the semiconductor substrate SUB in the region 4A.

Thereafter, the silicide layer SI is selectively formed on each upper surface of the diffusion regions PD and ND by the same method described above with reference to FIG. 12. Then, the conductive film CF2 is formed as in FIG. 6, the conductive film CF2 is polished as in FIG. 7, and the conductive film CF2 is patterned as in FIG. 8, whereby the metal pad layer MPAD is formed.

In the first modification, a stacked film including a barrier metal film and a metal film formed on the barrier metal film is applied as the conductive film CF2 to be the basis of the metal pad layer MPAD. The barrier metal film can be formed by, for example, the CVD method, and is made of for example, titanium nitride or tungsten nitride. The metal film can be formed by, for example, the CVD method, and is made of, for example, tungsten.

As described above, when the memory cell MC is formed in the bulk region, the problem that it is difficult to perform the silicidation due to the thin semiconductor layer SL of the SOI substrate does not occur, and thus the metal pad layer MPAD can be formed after forming the silicide layer SI. Further, the metal pad layer MPAD can function in the same manner as the pad layer PAD in the third embodiment.

(Second Modification)

Figure 28:
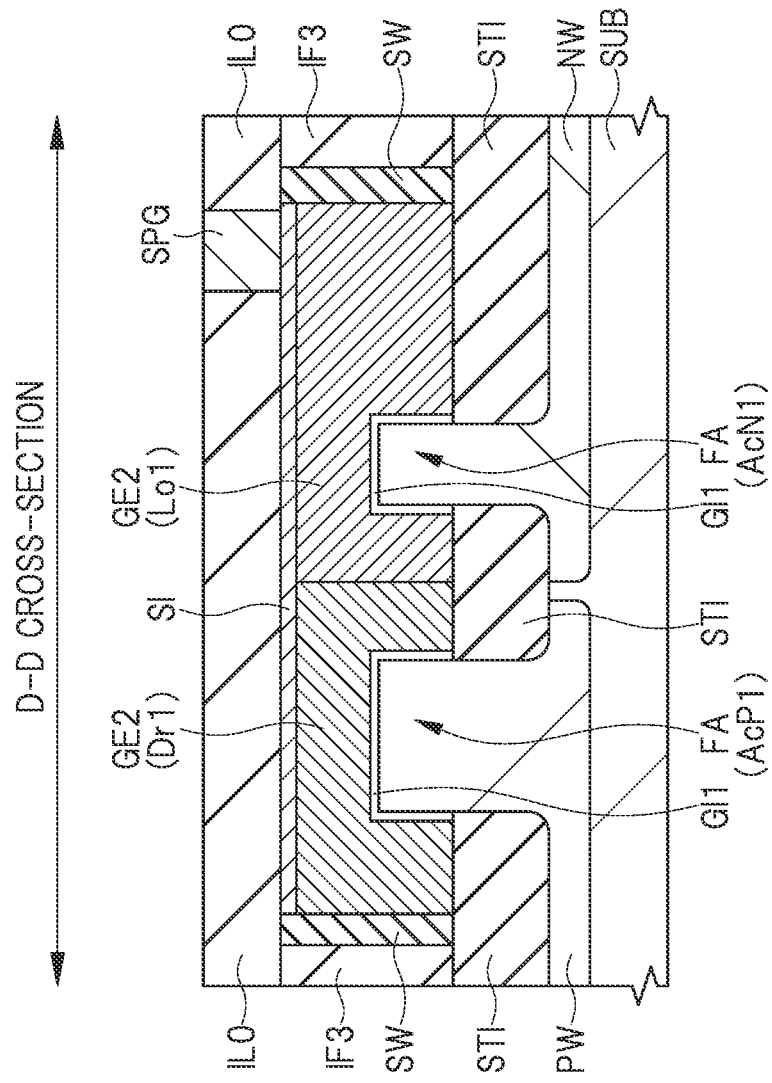
FIG. 28 is a cross-sectional view showing a semiconductor device according to the second modification.
Figure 29:
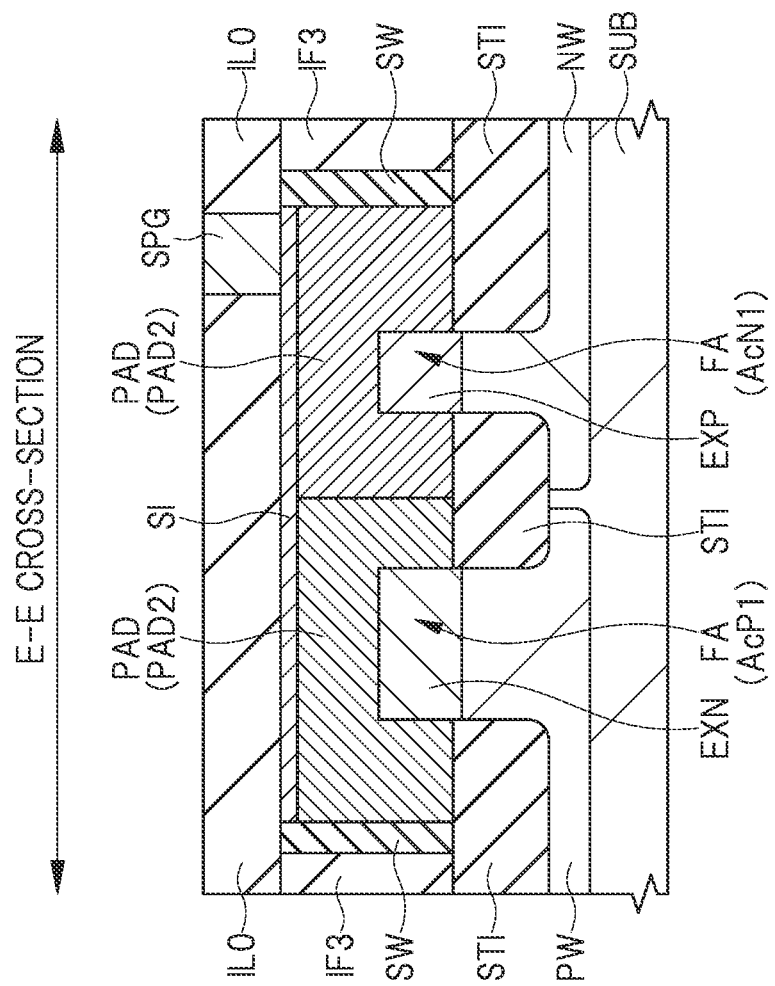
FIG. 29 is a cross-sectional view showing the semiconductor device according to the second modification.

A method of manufacturing a semiconductor device according to the second modification of the third embodiment will be described below with reference to FIG. 28 and FIG. 29. In the following description, the difference from the third embodiment will be mainly described. FIG. 28 and FIG. 29 are cross-sectional views along a line D-D (straight line) and a line E-E (straight line) shown in FIG. 2, respectively.

In the third embodiment described above, each transistor is a planar transistor, but each transistor is a fin transistor in the second modification.

As shown in FIG. 28 and FIG. 29, fins (projections) FA projecting from the upper surface of the semiconductor substrate are formed in the semiconductor substrate SUB. Each of the active regions including the active regions AcP1 and Acn1 in the drawing is formed as the fin FA. Such fins FA can be formed by performing the etching process to a part of the semiconductor substrate SUB.

As shown in FIG. 28 and FIG. 29, in the direction (X direction) orthogonal to the extending direction of the active regions AcP1 and AcN1 in a plan view, each gate pattern GP (each gate electrode) and each pad layer PAD are formed on the upper surface of the semiconductor substrate SUB so as to cover the upper surfaces and the side surfaces of the fins FA. Note that, as described in FIG. 8, the sidewall spacer SW between the gate electrode GE1 and the insulating film IF3 may be removed or left at the time of the patterning of the conductive film CF2.

Note that the cross-sectional view in the extending direction (Y direction) of the active regions AcP1 and AcN1 is almost the same as the cross-sectional view shown in FIG. 26 although there are some differences such as the depth of the element isolation portion STI.

As described above, since each gate pattern GP (each gate electrode) covers the upper surface and the side surface of the fin FA, the effective channel width of each transistor increases, so that the current amount of each transistor can be increased.

Further, since each pad layer PAD covers the upper surface and the side surface of the fin FA, the contact areas between the extension regions EXP and EXN and the pad layer PAD increase, so that the diffusion resistance can be reduced.

In the foregoing, the present invention has been specifically described based the embodiments, but the present invention is not limited to the embodiments described above and can be variously modified within the range not departing from the gist thereof.

What is claimed is:

1. A method of manufacturing a semiconductor device, comprising steps of:
   (a) providing an SOI substrate having a semiconductor substrate, an insulating layer formed on the semiconductor substrate, and a semiconductor layer formed on the insulating layer;
   (b) after the (a), forming a first conductive film on the semiconductor layer;
   (c) after the (b), forming a first insulating film on the first conductive film;
   (d) after the (c), patterning the first conductive film and the first insulating film, thereby forming a gate pattern and a cap film;
   (e) after the (d), implanting an impurity into the semiconductor layer located on both sides of the gate pattern, thereby forming a first impurity region;
   (f) after the (e), forming a first sidewall spacer made of a second insulating film on a side surface of the gate pattern;
   (g) after the (f), forming a second conductive film on the first impurity region so as to cover the gate pattern, the cap film, and the first sidewall spacer;
   (h) after the (g), performing a polishing process to the second conductive film until the cap film is exposed;
   (i) after the (h), patterning a part of the second conductive film, thereby forming a pad layer made of the remaining second conductive film;
   (j) after the (i), filling a portion, from where the second conductive film has been removed, with a third insulating film; and
   (k) after the (j), performing a polishing process to the cap film, the first sidewall spacer, the third insulating film, and the pad layer until the cap film is removed and the gate pattern is exposed.

2. The method of manufacturing the semiconductor device according to claim 1, further comprising steps of:
   (l) after the (k), implanting an impurity into the gate pattern and the pad layer; and
   (m) after the (l), forming a silicide layer on each upper surface of the gate pattern and the pad layer.

3. The method of manufacturing the semiconductor device according to claim 1, further comprising a step of:
   (n) between the (a) and the (b), forming a trench which penetrates the semiconductor layer and the insulating layer and reaches the semiconductor substrate and filling the trench with a fourth insulating film, thereby forming an element isolation portion,
   wherein the semiconductor layer, the insulating layer, and the semiconductor substrate are partitioned into a plurality of active regions by the element isolation portion,
   wherein the plurality of active regions includes a first active region and a second active region which is adjacent to the first active region via the element isolation portion in a plan view, and
   wherein the first impurity region formed in the semiconductor layer in the first active region and the first impurity region formed in the semiconductor layer in the second active region are connected by the same pad layer.

4. The method of manufacturing the semiconductor device according to claim 3, wherein the third insulating film is located on the element isolation portion.

5. The method of manufacturing the semiconductor device according to claim 3, further comprising a step of:
   (o) after the (k), forming a plurality of plugs on the gate pattern and the pad layer,
   wherein the plurality of active regions includes a third active region which is adjacent to the first active region via the element isolation portion in a plan view,
   wherein the gate pattern in the third active region extends on the element isolation portion so as to be adjacent to the pad layer in the first active region via the first sidewall spacer in the third active region, and
   wherein the plurality of plugs includes a shared contact plug connected to both of the gate pattern in the third active region and the pad layer in the first active region.

6. The method of manufacturing the semiconductor device according to claim 1,
   wherein the (g) further includes a step of forming a fifth insulating film on the second conductive film by a coating method, and
   wherein the fifth insulating film is removed by the polishing process in the (h).

7. The method of manufacturing the semiconductor device according to claim 1, wherein the second conductive film is made of silicon.

8. The method of manufacturing the semiconductor device according to claim 1, wherein the first insulating film and the third insulating film are made of silicon oxide, and wherein the second insulating film is made of silicon nitride.

9. A method of manufacturing a semiconductor device comprising steps of:
(a) providing an SOI substrate having a semiconductor substrate, an insulating layer formed on the semiconductor substrate, and a semiconductor layer formed on the insulating layer;
(b) after the (a), forming a first conductive film on the semiconductor layer;
(c) after the (b), forming a first insulating film on the first conductive film;
(d) after the (c), patterning the first conductive film and the first insulating film, thereby forming a gate pattern and a cap film;
(e) after the (d), implanting an impurity into the semiconductor layer located on both sides of the gate pattern, thereby forming a first impurity region;
(f) after the (e), forming a first sidewall spacer made of a second insulating film on a side surface of the gate pattern;
(g) after the (f), forming a second conductive film on the first impurity region so as to cover the gate pattern, the cap film, and the first sidewall spacer;
(h) after the (g), performing a polishing process to the second conductive film until the cap film is exposed;
(i) after the (h), patterning a part of the second conductive film, thereby forming a pad layer made of the remaining second conductive film;
(j) after the (i), filling a portion, from where the second conductive film has been removed, with a third insulating film;
(p) after the (j), making an upper surface of the pad layer recede such that the upper surface of the pad layer becomes lower than an upper surface of the gate pattern;
(q) after the (p), forming a sixth insulating film on the pad layer so as to cover the gate pattern, the cap film, and the first sidewall spacer;
(r) after the (q), performing an anisotropic etching to the sixth insulating film and the cap film, thereby removing the cap film and forming a second sidewall spacer made of the sixth insulating film on the side surface of the gate pattern;
(s) after the (r), forming a first silicide layer and a second silicide layer on the upper surface of the gate pattern and the upper surface of the pad layer exposed from the second sidewall spacer, respectively;
(t) after the (s), forming a seventh insulating film on the first silicide layer and the second silicide layer;
(u) after the (t), performing a polishing process to the seventh insulating film such that the second silicide layer formed on the upper surface of the pad layer is covered with the seventh insulating film and the first silicide layer formed on the upper surface of the gate pattern is removed;
(v) after the (u), removing the gate pattern and filling a portion, from where the gate pattern has been removed, with a metal film; and
(w) after the (v), performing a polishing process to the seventh insulating film until the second silicide layer is exposed.

10. The method of manufacturing the semiconductor device according to claim 9, further comprising a step of:
(n) between the (a) and the (b), forming a trench which penetrates the semiconductor layer and the insulating layer and reaches the semiconductor substrate and filling the trench with a fourth insulating film, thereby forming an element isolation portion,
wherein the third insulating film is located on the element isolation portion,
wherein the semiconductor layer, the insulating layer, and the semiconductor substrate are partitioned into a plurality of active regions by the element isolation portion,
wherein the plurality of active regions includes a first active region and a second active region which is adjacent to the first active region via the element isolation portion in a plan view, and
wherein the first impurity region formed in the semiconductor layer in the first active region and the first impurity region formed in the semiconductor layer in the second active region are connected by the same pad layer.

11. The method of manufacturing the semiconductor device according to claim 10, further comprising a step of:
(x) after the (w), forming a plurality of plugs on the metal film and the second silicide layer,
wherein the plurality of active regions includes a third active region which is adjacent to the first active region via the element isolation portion in a plan view,
wherein the metal film of the third active region extends on the element isolation portion so as to be adjacent to the pad layer in the first active region via the first sidewall spacer in the third active region, and
wherein the plurality of plugs includes a shared contact plug connected to both of the metal film in the third active region and the second silicide layer in the first active region.

12. The method of manufacturing the semiconductor device according to claim 9, further comprising a step of:
(y) between the (a) and the (b), removing a part of the semiconductor layer and the insulating layer of the SOI substrate, thereby forming a bulk region,
wherein the (b) to the (j) and the (p) to the (w) are performed also on the semiconductor substrate in the bulk region,
wherein the gate pattern in the bulk region is left in the (v), and
wherein a step of forming a third silicide layer on the upper surface of the gate pattern in the bulk region is performed after the (w).

13. A method of manufacturing a semiconductor device, comprising steps of:
(a) forming a first conductive film on a semiconductor substrate;
(b) after the (a), forming a first insulating film on the first conductive film;
(c) after the (b), patterning the first conductive film and the first insulating film, thereby forming a gate pattern and a cap film;
(d) after the (c), implanting an impurity into the semiconductor substrate located on both sides of the gate pattern, thereby forming a first impurity region;
(e) after the (d), forming a first sidewall spacer made of a second insulating film on a side surface of the gate pattern;
(f) after the (e), forming a second conductive film on the first impurity region so as to cover the gate pattern, the cap film, and the first sidewall spacer;
(g) after the (f), performing a polishing process to the second conductive film until the cap film is exposed;

(h) after the (g), patterning a part of the second conductive film, thereby forming a pad layer;

(i) after the (h), filling a portion from where the second conductive film has been removed, with a third insulating film; and (j) after the (i), forming a silicide layer on an upper surface of the pad layer, wherein each of the first conductive film and the second conductive film is made of silicon.

14. The method of manufacturing the semiconductor device according to claim 13, further comprising steps of:

(k) between the (e) and the (f), implanting an impurity into the semiconductor substrate located on both sides of the gate pattern via the first sidewall spacer, thereby forming a second impurity region having an impurity concentration higher than that of the first impurity region; and (l) between the (k) and the (f), forming a silicide layer on the second impurity region, wherein, in the (f), the second conductive film is formed on the silicide layer, and wherein the second conductive film is composed of a stacked film including a barrier metal film and a metal film formed on the barrier metal film.

15. The method of manufacturing the semiconductor device according to claim 13, further comprising a step of:

(m) before the (a), performing an etching process to a part of the semiconductor substrate, thereby forming a projection that projects from an upper surface of the semiconductor substrate, wherein the gate pattern and the pad layer are formed on the upper surface of the semiconductor substrate so as to cover an upper surface and a side surface of the projection.

16. The method of manufacturing the semiconductor device according to claim 13, further comprising a step of:

(n) before the (a), forming a trench in the semiconductor substrate and filling the trench with a fourth insulating film, thereby forming an element isolation portion, wherein the third insulating film is located on the element isolation portion.

* * * * *